United States Patent
Park et al.

(10) Patent No.: US 10,438,666 B2
(45) Date of Patent: Oct. 8, 2019

(54) NONVOLATILE MEMORY DEVICE AND AN ERASE METHOD THEREOF

(71) Applicant: SAMSUNG ELECTRONICS CO., LTD., Suwon-si, Gyeonggi-do (KR)

(72) Inventors: Ji-yoon Park, Suwon-si (KR); Wan-dong Kim, Seoul (KR); Seung-bum Kim, Hwaseong-si (KR); Deok-woo Lee, Suwon-si (KR); You-se Kim, Hwaseong-si (KR); Se-hwan Park, Yongin-si (KR); Jin-woo Park, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/043,964

(22) Filed: Jul. 24, 2018

(65) Prior Publication Data

US 2019/0156896 A1    May 23, 2019

(30) Foreign Application Priority Data

Nov. 20, 2017    (KR) .......................... 10-2017-0154978

(51) Int. Cl.
| G11C 16/16 | (2006.01) |
| G11C 11/56 | (2006.01) |
| G11C 16/04 | (2006.01) |
| G11C 16/34 | (2006.01) |

(52) U.S. Cl.
CPC .......... *G11C 16/16* (2013.01); *G11C 11/5635* (2013.01); *G11C 16/0483* (2013.01); *G11C 16/3445* (2013.01)

(58) Field of Classification Search
CPC .................................................. G11C 16/16
USPC .................................................... 365/185.29
See application file for complete search history.

(56) References Cited

U.S. PATENT DOCUMENTS

| 8,760,935 B2 | 6/2014 | Takekida |
| 8,873,293 B1 | 10/2014 | Ou et al. |
| 8,929,148 B2 | 1/2015 | Kim |
| 9,064,584 B2 | 6/2015 | Jung |
| 9,330,778 B2 | 5/2016 | Costa et al. |
| 2006/0256623 A1 | 11/2006 | Roohparvar |

(Continued)

FOREIGN PATENT DOCUMENTS

| KR | 10-0402942 | 10/2003 |
| KR | 10-0548591 | 4/2006 |
| KR | 10-2012-0069115 | 6/2012 |

*Primary Examiner* — Hoai V Ho
(74) *Attorney, Agent, or Firm* — F. Chau & Associates, LLC

(57) ABSTRACT

A method of erasing a memory device, the method of erasing the memory device including: performing, in a first erase period, a first erase operation on memory cells respectively connected to a plurality of word lines, wherein at least one of the memory cells, which is included in a memory block, is not erase-passed; determining, after the first erase period, an erase operation speed by applying a verify voltage to at least one of the plurality of word lines, and determining an effective erasing time for each word line based on the determined erase operation speed; and performing, in a second erase period, a second erase operation on the memory cells respectively connected to the plurality of word lines based on the determined effective erasing times.

20 Claims, 19 Drawing Sheets

(56) References Cited

U.S. PATENT DOCUMENTS

2012/0243309 A1* 9/2012 Asaoka .............. G11C 16/0483
                                                                 365/182
2017/0069389 A1* 3/2017 Park ....................... G11C 16/14
2017/0372789 A1* 12/2017 Ray .................... G11C 16/0483

* cited by examiner

NONVOLATILE MEMORY DEVICE AND AN ERASE METHOD THEREOF

CROSS-REFERENCE TO RELATED APPLICATION

This application claims priority under 35 U.S.C. § 119 to Korean Patent Application No. 10-2017-0154978, filed on Nov. 20, 2017, in the Korean Intellectual Property Office, the disclosure of which is incorporated by reference herein in its entirety.

TECHNICAL FIELD

The inventive concept relates to a nonvolatile memory device, and more particularly, to an erase method of a nonvolatile memory device.

DISCUSSION OF RELATED ART

Semiconductor memory devices include volatile memory devices and nonvolatile memory devices. Volatile memory devices require power to maintain stored data. Nonvolatile memory devices can retain stored data in the absence of power. The volatile semiconductor memory device may have fast read and write speeds. On the other hand, the nonvolatile memory device may be slow in reading and writing compared with the volatile semiconductor memory device.

A flash memory device is an example of the nonvolatile memory device. The flash memory device may be used in various applications due to its characteristics such as large capacity, low noise, and low power. The flash memory device may erase memory blocks by applying an erase voltage to a substrate and lowering threshold voltages of memory cells. When the erase speed is different for each word line, widths of threshold voltage distributions of erased memory cells may be large, which can lead to performance degradation.

SUMMARY

According to an exemplary embodiment of the inventive concept, there is provided an erase method of a memory device, the erase method including: performing, in a first erase period, a first erase operation on memory cells respectively connected to a plurality of word lines, wherein at least one of the memory cells, which is included in a memory block, is not erase-passed; determining, after the first erase period, an erase operation speed by applying a verify voltage to at least one of the plurality of word lines, and determining an effective erasing time for each word line based on the determined erase operation speed; and performing, in a second erase period, a second erase operation on the memory cells respectively connected to the plurality of word lines based on the determined effective erasing times.

According to an exemplary embodiment of the inventive concept, there is provided a memory device including: a memory cell array comprising memory cells respectively connected to word lines; and a control logic configured to perform a first erase operation such that at least one of the memory cells respectively connected to the word lines is not erase-passed, control a verify voltage to be applied to at least one of the word lines, and to control, during a second erase period after the verify voltage has been applied, an effective erasing time for each word line, wherein the effective erasing time is based on an error rate of memory cells respectively connected to the word lines to which the verify voltage is applied, and wherein the effective erasing time is a time during which a second erase operation is performed.

According to an exemplary embodiment of the inventive concept, there is provided an erase method of a memory device including a plurality of word lines vertically stacked on a substrate, the erase method of the memory device including: performing, in a first erase period, a first erase operation so that at least one of memory cells included in a first memory region and a second memory region is not erase-passed, wherein the first and second memory regions each include memory cells connected to one or more word lines among the plurality of word lines; applying a verify voltage to a first word line connected to the first memory region and a second word line connected to the second memory region; and performing, in a second erase period, a second erase operation on the first memory region based on a first effective erase time that is determined for the first memory region based on a number of off cells among memory cells connected to the first word line, and performing, in the second erase period, the second erase operation on the first memory region based on a second effective erase time that is determined for the second memory region based on a number of off-cells among memory cells connected to the second word line, wherein, when the number of the off-cells in the second memory region is larger than the number of the off-cells in the first memory region, a second effective erase time for the second memory region is determined to be longer than a first effective erase time for the first memory region.

According to an exemplary embodiment of the inventive concept, there is provided a method of erasing a memory device, the method of erasing the memory device including: performing a first erase operation on a memory block, wherein the memory block includes a first region including a first memory cell connected to a first word line and a second region including a second memory cell connected to a second word line, wherein the second memory cell is not erase-passed; determining a first effective erase time for the first region and a second effective erase time for the second region, wherein the second effective erase time is greater than the first effective erase flare; and performing a second erase operation on the first and second memory cells, wherein a first effective inhibit time of the first region which occurs after the first effective erase time is longer than a second effective inhibit time of the second region which occurs after the second effective erase time.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Hereinafter, exemplary embodiments of the inventive concept will be described in detail with reference to the accompanying drawings in which like numerals may refer to like elements.

Figure 1:
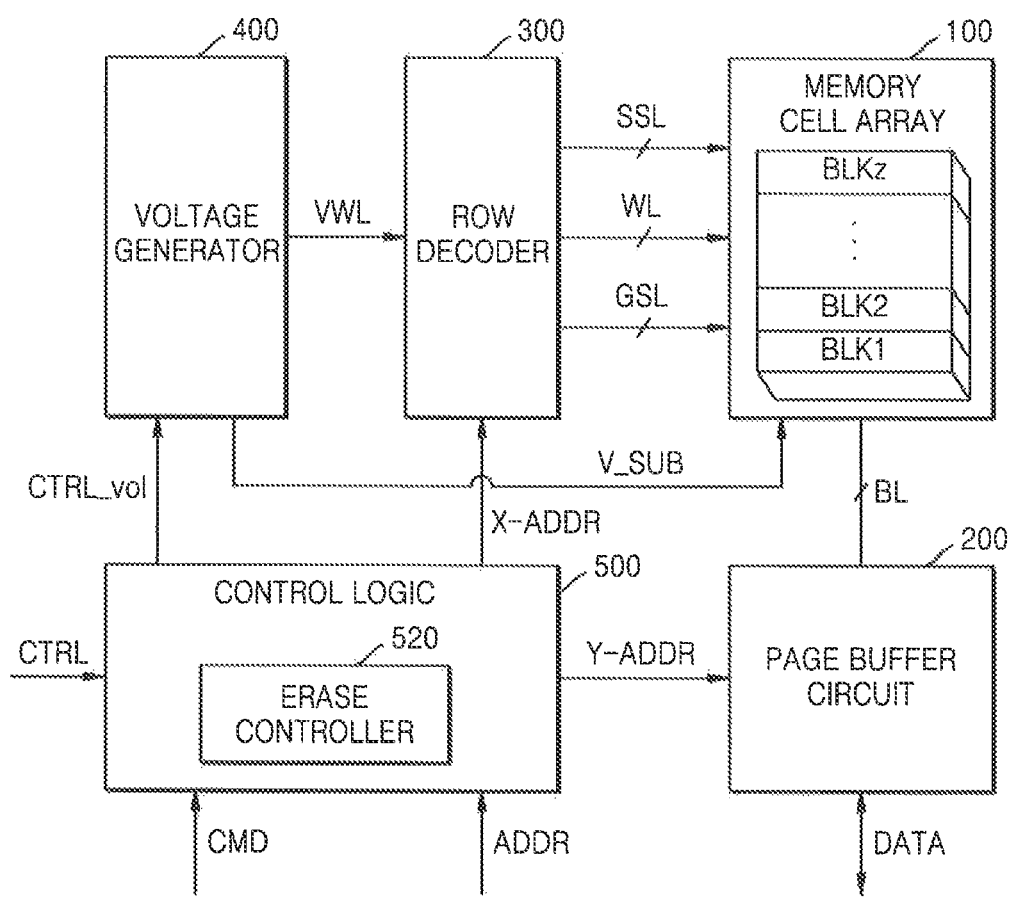
FIG. 1 illustrates a memory device according to an exemplary embodiment of the inventive concept.
Figure 2A:
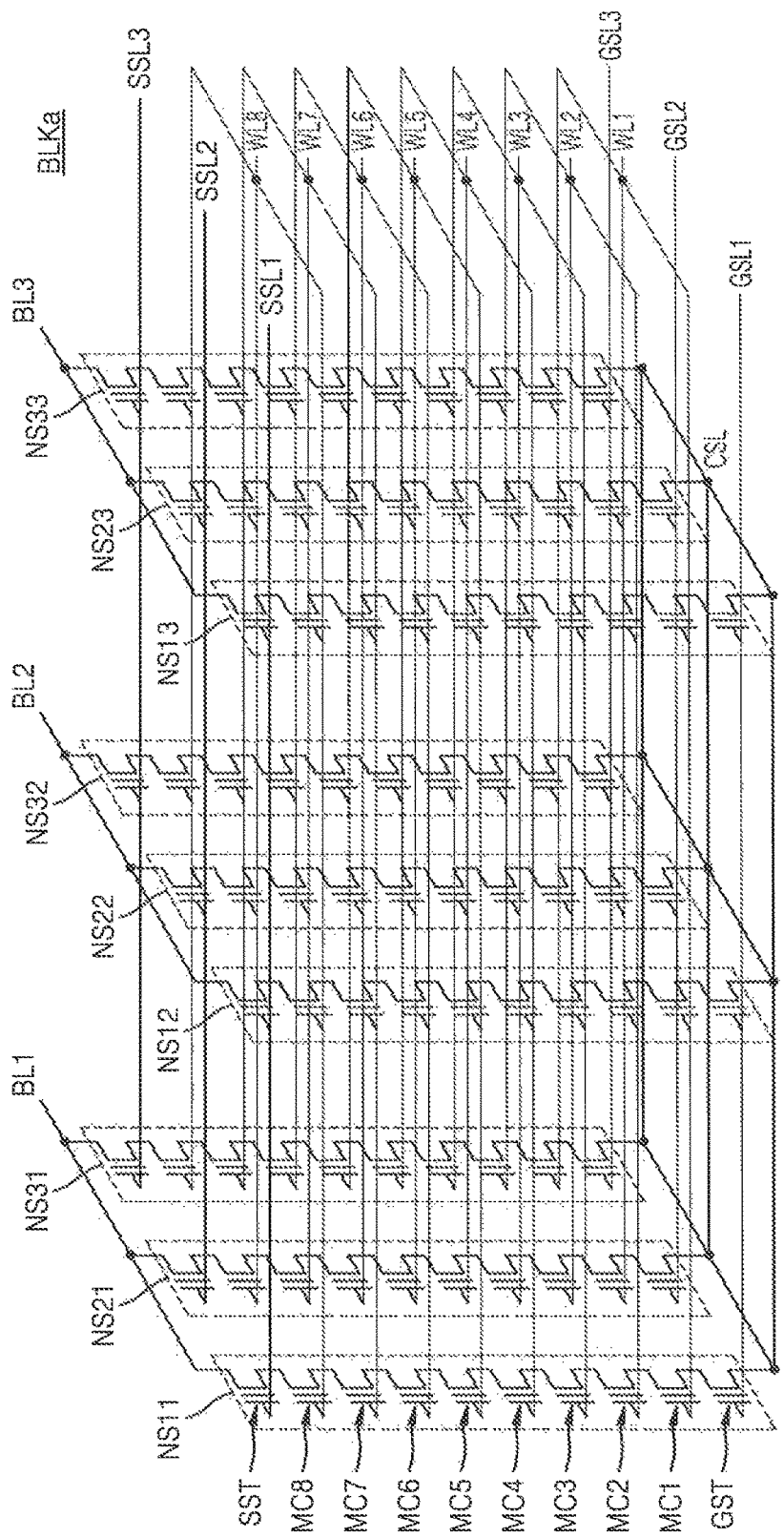
FIGS. 2A and 2B illustrate a memory block according to an exemplary embodiment of the inventive concept.
Figure 2B:
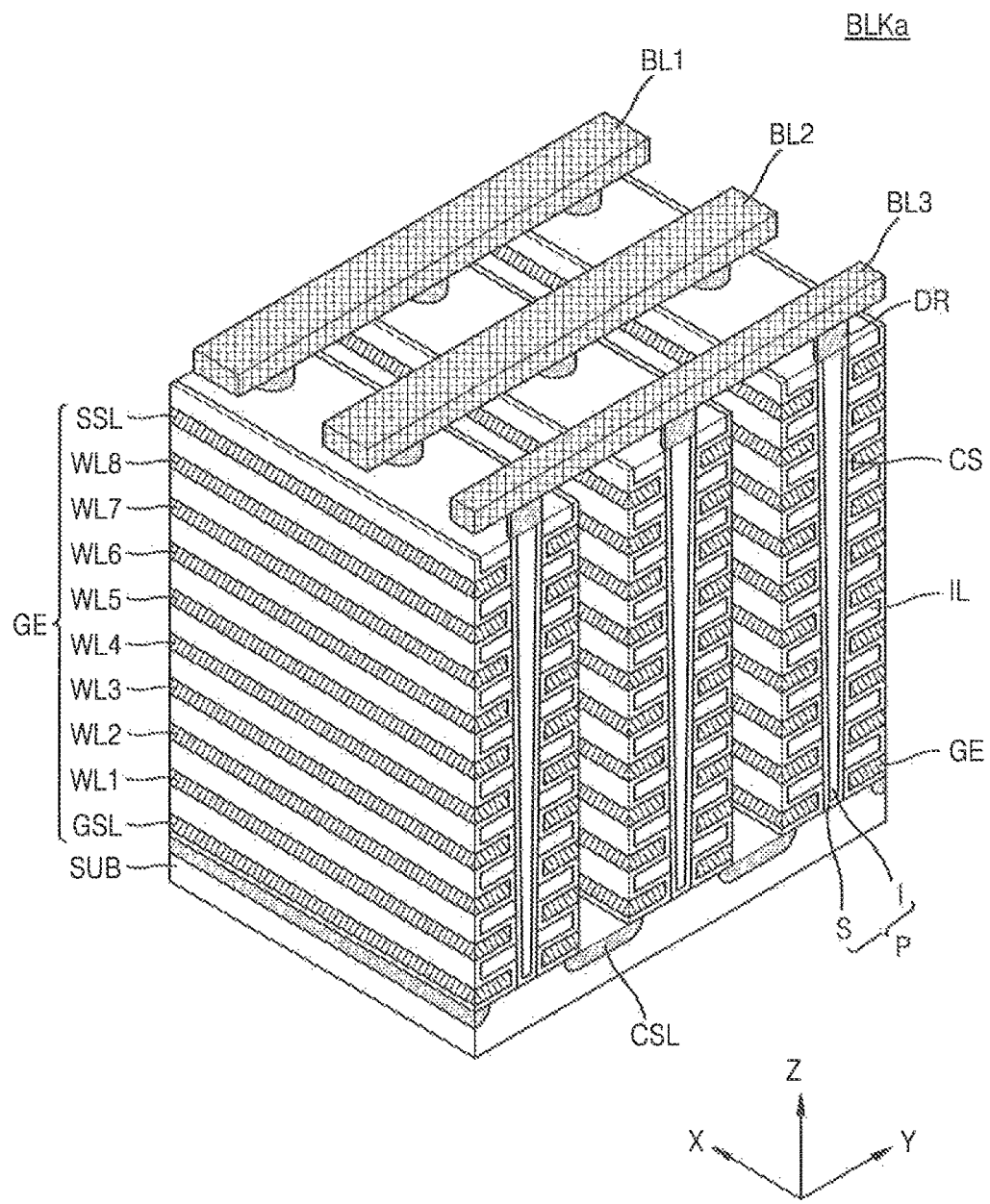

FIG. 1 illustrates a memory device 10 according to an exemplary embodiment of the inventive concept. The memory device 10 may include a memory cell array 100, a page buffer circuit 200, a row decoder 300, a voltage generator 400, and a control logic 500. The memory device 10 is illustrated as including one memory cell array 100, but the inventive concept is not limited thereto. For example, the memory device 10 may include a plurality of memory cell arrays 100. The memory cell array 100 may include a plurality of memory cells in regions where a plurality of word lines and a plurality of bit lines cross each other. For example, the plurality of memory cells may be nonvolatile memory cells. The memory cell array 100 may include a NAND flash memory, a vertical NAND (VNAND) flash memory, a NOR flash memory, a resistive random-access memory (RAM), a phase-change RAM (PRAM), a magnetoresistive RAM (MRAM), a ferroelectric RAM (FRAM), a spin transfer torque RAM (STT-RAM), etc. The memory cell array 100 may be a two-dimensional array structure, or a three-dimensional array structure as shown in FIGS. 2A and 2B. Hereinafter, for convenience of explanation, it is assumed that the memory device 10 is a NAND flash memory device, but the inventive concept is not limited thereto.

The memory cell array 100 may include a plurality of memory blocks BLK1 through BLKz (z is an integer of 2 or more). Each of the memory blocks BLK1 through BLKz may include a plurality of memory cells. Each memory cell may be a multi-level cell (MLC) storing two bits of data or more. For example, each memory cell may be a 2-bit MLC storing 2 bits of data, a triple level cell (TLC) storing 3 bits of data, a quadruple level cell (QLC) storing 4 bits of data, or a MLC storing 5 bits of data or more. However, the inventive concept is not limited thereto, and for example, some memory cells may be single level cells (SLC) storing just one bit of data, while other memory cells may be MLCs storing more than one bit of data. The memory cell array 100 may be connected to the row decoder 300 via word lines WL, string selection lines SSL, and ground select lines GSL, and may be connected to the page buffer circuit 200 via bit lines BL. The memory cell array 100 may include strings respectively connected to the bit lines BL. Here, each of the strings may include at least one string selection transistor connected in series between the hit line BL and a common source line CSL, a plurality of the memory cells, and at least one ground selection transistor. Each of the strings may further include at least one dummy cell between the string selection transistor and the memory cells, and at least one dummy cell between the ground selection transistor and the memory cells.

The page buffer circuit 200 may be connected to the memory cell array 100 via the bit lines BL, and may perform a data write operation or a data read operation in response to a page buffer control signal received from the control logic 500. The page buffer circuit 200 may be connected to data lines DL by selecting the bit lines EL and using a decoded column address Y-ADDR.

The row decoder 300 may select some of the word lines WL based on a row address X-ADDR. The row decoder 300 may transfer a word line application voltage to the word lines WL. In the data write operation, the row decoder 300 may apply a programming voltage and a verify voltage to the selected word line WL, and a program inhibit voltage to an unselected word liras WL. In the data read operation, the row decoder 300 may apply a read voltage to the selected word line WL and the read inhibit voltage to the unselected word line WL. In a data erase operation, the row decoder 300 may apply a word line erase voltage to the word line WL. In addition, the row decoder 300 may select some string selection lines or some ground selection lines based on the row address X-ADDR.

The voltage generator 400 may generate various kinds of voltages to perform the write, read, and erase operations in the memory cell array 100 based on a voltage control signal CTRL_vol. For example, the voltage generator 400 may generate a word line drive voltage VWL to drive the word lines WL. Here, the word line drive voltage VWL may include a write voltage, a read voltage, a word line erase voltage, a write verify voltage, and the like. The voltage generator 400 may generate a substrate voltage V_SUB to be applied to a substrate of the memory device 10 during the erase operation. In addition, the voltage generator 400 may generate a string selection line driving voltage to drive the string selection lines SSL and a ground selection line driving voltage VGSL to drive the ground selection lines GSL.

The control logic 500 may generate various internal control signals to store data DATA in the memory cell array 100 or read data DATA from the memory cell array 100 based on a command CMD, an address ADDR, and a control signal CTRL received from a memory controller. In other words, the control logic 500 may control various operations in the memory device 10. The various internal control signals outputted from the control logic 500 may be provided to the page buffer circuit 200, the row decoder 300, the voltage generator 400, and the like. For example, the control logic 500 may provide the column address Y-ADDR to the page buffer circuit 200, the row address X-DDR to the row decoder 300, and the voltage control signal CTRL_vol to the voltage generator 400. However, types of the control signals are not limited thereto, and the control logic 500 may further provide other internal control signals. For example, the control logic 500 may provide a page buffer control signal to the page buffer circuit 200.

The control logic 500 may include an erase controller 520. The erase controller 520 may control the erase operation of the memory device 10. For example, the erase controller 520 may control an erase operation time and a voltage applied to the word line WL or the substrate. An operation of the erase controller 520 will be described in more detail later.

For convenience, an erase operation will now be defined. A period where the erase operation is performed will be referred to as an erase period. A time required for the erase period will be referred to as an erase time. The erase period may include a develop period and an erase execution period. In the develop period, the substrate erase voltage is developed on the substrate, and in the erase execution period, the erase operation is performed. A time required for the develop period will be referred to as a develop time, and a time required for the erasing execution period will be referred to as an erasing time.

The memory device 10 according to the present embodiment, when performing the erase operation on a memory block basis, may perform a first erase operation such that at least some of the memory cells included in the memory block in the first erase period are not erase-passed, verify a speed of the first erase operation, and then, determine an effective erase time in a second erase operation for each word line WL based on the verification result. A speed at which the memory cell is erased will be referred to as an erase operation speed. An effective erase time may denote a time in which the erase operation is substantially performed in the second erase execution period. For example, the control logic 500 in the memory device 10 may increase the operating speed of the first erase operation for memory cells connected to a particular word line WL, so that the erase operation of the memory cells in the second erase execution period of the second erase operation is performed in a shorter time. According to an erasing method of the memory device described above, the widths of the threshold voltage distributions of the erased memory cells may be narrowed, and thus, a deep erase may be prevented. This is accomplished, for example, by adjusting the effective erasing execution time for each word line WL in consideration of the erase time of a memory cell.

FIGS. 2A and 2B illustrate a memory block BLKa according to an exemplary embodiment of the inventive concept.

Referring to FIG. 2A, the memory block BLKa may correspond to one of the memory blocks BLK1 through BLKz illustrated in FIG. 1. The memory block BLKa may include one or more ground selection lines GSL1 through GSLS3, one or more string selection lines (first through third string selection lines) SSL1 through SSL3, and the common source line CSL. Here, the number of NAND strings, the number of word lines WL, the number of bit lines BL, the number of ground selection lines GSL, and the number of string selection lines SSL may be variously changed according to an exemplary embodiment of the inventive concept. In addition, the number of ground selection lines GSL and the number of string selection lines SSL may be different from each other.

The NAND strings NS11, NS21, and NS31 may be between a first bit line BL1 and the common source line CSL, the NAND strings NS12, NS22, and NS32 may be between a second bit line BL2 and the common source line CSL, and the NAND strings NS13, NS23, and NS33 may be between a third bit line BL3 and the common source line CSL. Each NAND string (for example, NS11) may include the string selection transistor SST, a plurality of memory cells MC (e.g., MC1 to MCS), and the ground selection transistor GST, which are connected to each other in series.

NAND strings connected in common to one bit line BL may constitute one column. For example, the NAND strings NS11, NS21 and NS31 commonly connected to the first bit line BL1 may correspond to a first column, the NAND strings NS12, NS22 and NS32 commonly connected to the second bit line BL2 may correspond to a second column, and the NAND strings NS13, NS23 and NS33 connected in common to the third bit line BL3 may correspond to a third column.

The NAND strings connected in common to one string selection line SSL may constitute one row. For example, the NAND strings NS11, NS12, NS13 connected to the first string selection line SSL1 may correspond to a first row, the NAND strings NS21, NS22, NS23 connected to the second string selection line SSL2 may correspond to a second row, and the NAND strings NS31, NS32, NS33 connected to the third string selection line SSL3 may correspond to a third row.

A string selection transistor SST may be connected to each of the string selection lines SSL1 through SSL3. The plurality of memory cells MC may be connected to each of word lines WL1 to WL8. The ground selection transistor GST may be connected to each of the ground selection lines GSL1 through GSL3. The string selection transistors SST may be connected to corresponding bit lines BL1 through BL3, and the ground selection transistors GST may be connected to corresponding ground selection lines GSL1 through GSL3, Referring to FIG. 2B, the memory block BLKa may be formed in a direction perpendicular to a substrate SUB. In FIG. 2B, the memory block BLKa is shown as including two select lines GSL and SSL, eight word lines WL1 through WL8, and three bit lines BL1 through BL3, however, the numbers of the select lines, the word lines, and the bit lines may be variously changed.

The substrate SUB may include a first conductivity type (for example, a p-type) semiconductor, and a common source line CSL that is doped with impurities of a second conductivity type (for example, an n-type) semiconductor and extends in a first direction (for example, an X direction) on the substrate SUB. A plurality of insulating layers IL extending in the first direction (e.g., the X direction) may be sequentially provided in a third direction (for example, a Z direction) on a region of the substrate SUB between two adjacent common source lines CSL, and the plurality of insulating films IL may be spaced apart front each other by a certain distance in the third direction. For example, the plurality of insulating layers IL may include an insulating material such as silicon oxide.

A plurality of pillars P may be arranged sequentially in the first direction (e.g., the X direction) in the region of the substrate SUB, between two adjacent common source lines CSL, and penetrate through the plurality of insulating films IL in the third direction (e.g., the Z direction). For example, the plurality of pillars P may contact the substrate SUB through the plurality of insulating layers IL. A surface layer S of each pillar P may include a silicon material having a first type and may function as a channel region. The inner layer I of each pillar P may include an insulating material such as silicon oxide or an air gap.

A charge storage layer CS may be provided along exposed surfaces of the insulating layers IL, the pillars P and the substrate SUB in the region between two adjacent common source lines CSL. The charge storage layer CS may include a gate insulating layer (or a tunnelling insulating layer), a charge trap layer, and a blocking insulating layer. For example, the charge storage layer CS may have an oxide-nitride-oxide (ONO) structure. In addition, a gate electrode GE such as the select lines GSL and SSL, and the word lines WL1 through WL8, may be on an exposed surface of the charge storage layer CS, in the region between two adjacent common source lines CSL, Drains or drain contacts DR may be provided on each of the plurality of pillars P. For example, the drains or the drain contacts DR may include a silicon material doped with impurities of the second conductivity type. The first through third bit lines BL1 through BL3 may be provided on the drain contacts DR that extend in a second direction (for example, a Y direction) and are spaced apart by a certain distance in the first direction.

Figure 3:
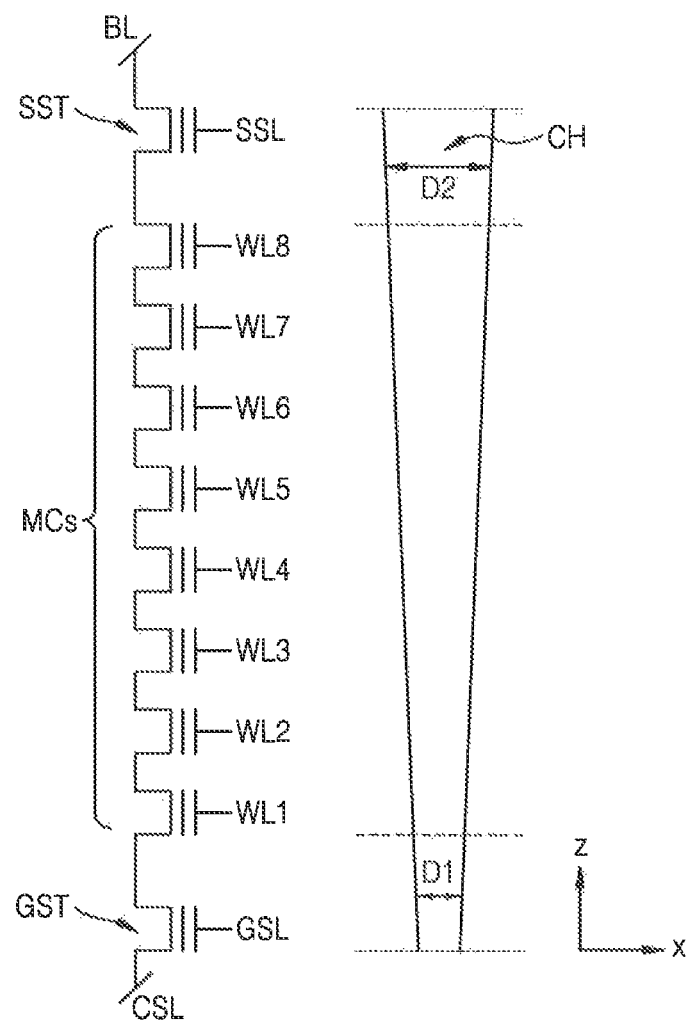
FIG. 3 illustrates a channel hole of a cell string of the memory block of FIGS. 2A and 2B according to an exemplary embodiment of the inventive concept.

FIG. 3 illustrates a channel hole CH of a cell string of the memory block BLKa of FIGS. 2A and 2B according to an exemplary embodiment of the inventive concept. Referring to FIG. 2B, the pillars P may be formed in the channel hole CH, which is formed by etching a mold formed by stacking the ground selection line GSL, the word lines WL1 through WL8, and the string selection line SSL.

A diameter of the channel hole CH may be reduced as the channel bole CH is closer to the substrate SUB. Accordingly, a channel hole size D2 in the vicinity of the string selection transistor SST may be greater than a channel hole size in the vicinity of the ground selection transistor GST. This is because the channel hole CH is formed by etching from the top of the mold in a direction of the substrate SUB. In other words, the etching is performed from top to bottom. Since the channel hole size D2 at a position corresponding to the string selection transistor SST is greater than the channel hole size D1 at a position corresponding to the ground selection transistor GST, a channel width of the string selection transistor SST may be greater than a channel width of the ground selection transistor GST. In other words, a size of the string selection transistor SST may be greater than a size of the ground selection transistor GST. As a result, the speed of a data operation such as the write operation, the read operation, and the erase operation with respect to the memory cells MC in the same memory block may gradually decrease moving from the ground selection transistor GST toward the string selection transistor SST. Accordingly, when the erase operation is performed during the same erase execution operation time in the memory block, there is a difference in the threshold voltage distribution between the memory cell located near the string selection transistor SST and the memory cell located near the ground selection transistor GST. This threshold voltage distribution difference may cause the width of the threshold voltage distribution of the memory cell in an erase state to increase.

Figure 4A:
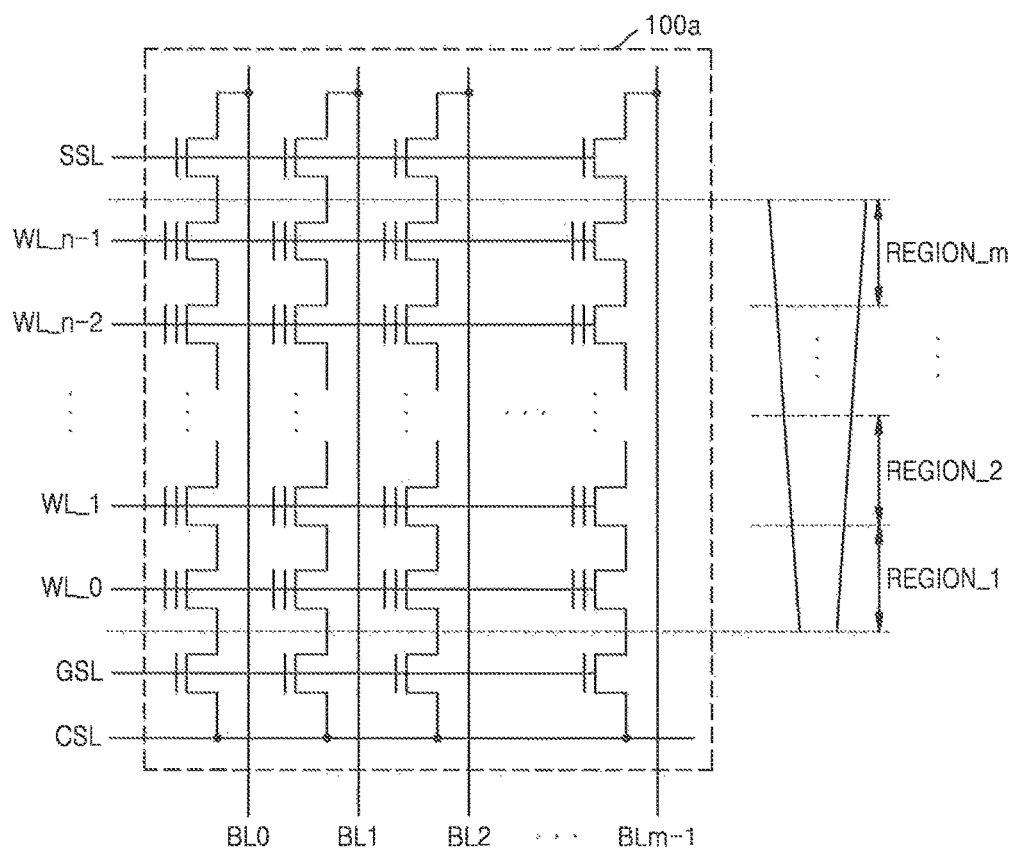
FIGS. 4A and 4B respectively illustrate memory cell arrays according to an exemplary embodiment of the inventive concept.
Figure 4B:
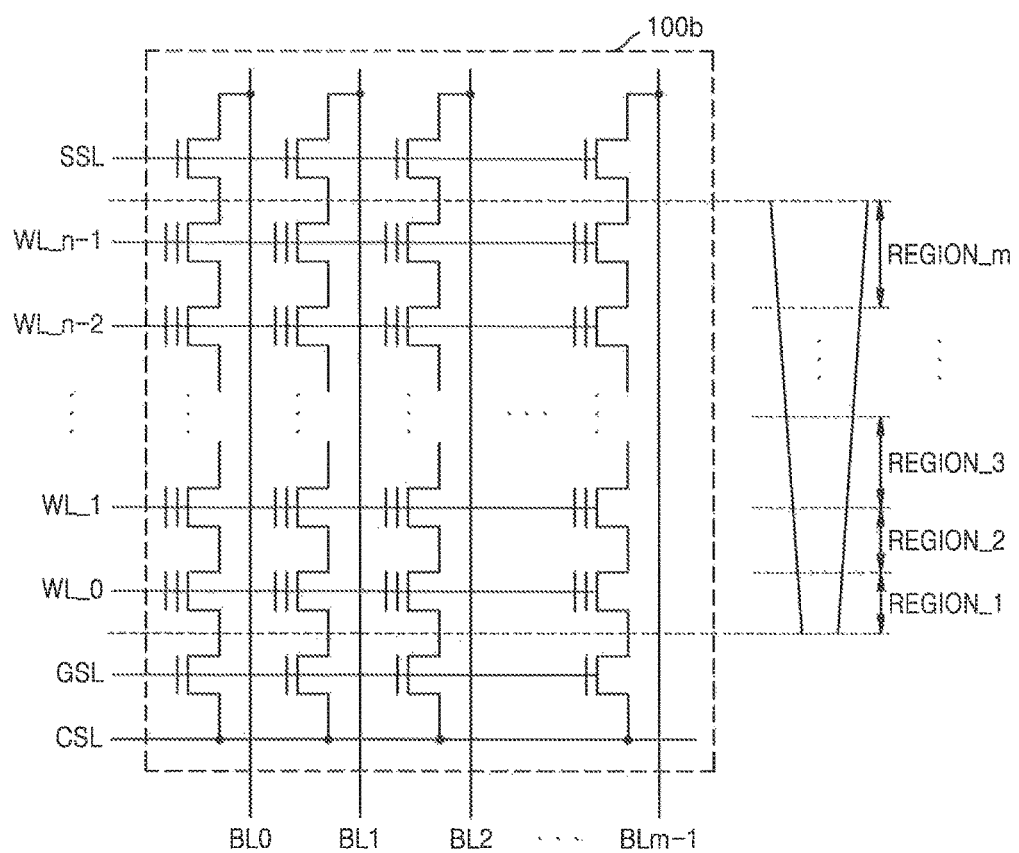

FIGS. 4A and 4B respectively illustrate memory cell arrays 100a and 100b according to an exemplary embodiment of the inventive concept Although the memory cell arrays 100a and 100b include the plurality of memory blocks BLK1 to BLKz, only one memory block will be illustrated for convenience of description.

As illustrated in FIGS. 4A and 4B, the memory block may include memory cells connected to n word lines WL_0 through WL_n−1 (n is a natural number). A set of memory cells connected to one word line WL may be referred to as a memory page. A set of memory cells connected between one bit line BL and the common source line CSL may be referred to as a string. The memory blocks included in the memory cell arrays 100a and 100b may be the memory blocks of the three-dimensional structure described with reference to FIGS. 2A and 2B.

Referring to FIGS. 1 and 4A, the control logic 500 in the memory device 10 may divide and manage the memory blocks in the memory cell array 100a into m memory regions REGION_1 through REGION_m (m is a natural number). For example, the control logic 500 may control an effective erasing time for each memory region to be different, when performing the erase operation. The first through $m^{th}$ memory regions REGION_1 through REGION_m may include the same number of memory pages.

When the memory block is the memory block of the three-dimensional structure described with reference to FIGS. 2A and 2B, the channel hole size at a position near a memory cell connected to a word line WL close to the substrate SUB may be less than the channel hole size at a position near a memory cell connected to a word line WL far from the substrate SUB. Thus, the channel hole size of the memory block may gradually increase from the first memory region REGION_1 toward the $m^{th}$ memory region REGION_m. In addition, for example, the speed of a data operation on the memory cells may gradually decrease from the first memory region REGION_1 toward the $m^{th}$ memory region REGION_m.

Referring to FIGS. 1 and 4B, the control logic 500 in the memory device 10 may divide and manage the memory blocks in the memory cell array 100b into m memory regions REGION_1 through REGION_m. For example, the control logic 500 may control an effective erasing time for each memory region differently, when performing the erase operation. The first through $m^{th}$ memory regions REGION_1 through REGION_m may include different numbers of memory pages.

When the memory block is the memory block of the three-dimensional structure described with reference to FIGS. 2A and 2B, the channel hole size at a position near a memory cell connected to a word line WL close to the substrate SUB may be less than the channel hole size at a position near a memory cell connected to a word line WL far from the substrate SUB. Thus, the channel hole size of the memory block may gradually increase from the first memory region REGION_1 toward the $m^{th}$ memory region REGION_m. In addition, for example, the speed of a data operation on the memory cells may gradually decrease from the first memory region REGION_1 toward the $m^{th}$ memory region REGION_m. In addition, since the difference in the characteristics of the memory cells connected to adjacent word lines WL can be larger near places where the channel holes are small, the control logic 500 may set a size of the memory region near the substrate to be less than a size of the memory region far from the substrate. For example, the number of memory pages included in the memory region may gradually increase from the first memory region REGION_1 toward the $m^{th}$ memory region REGION_m.

Figure 5:
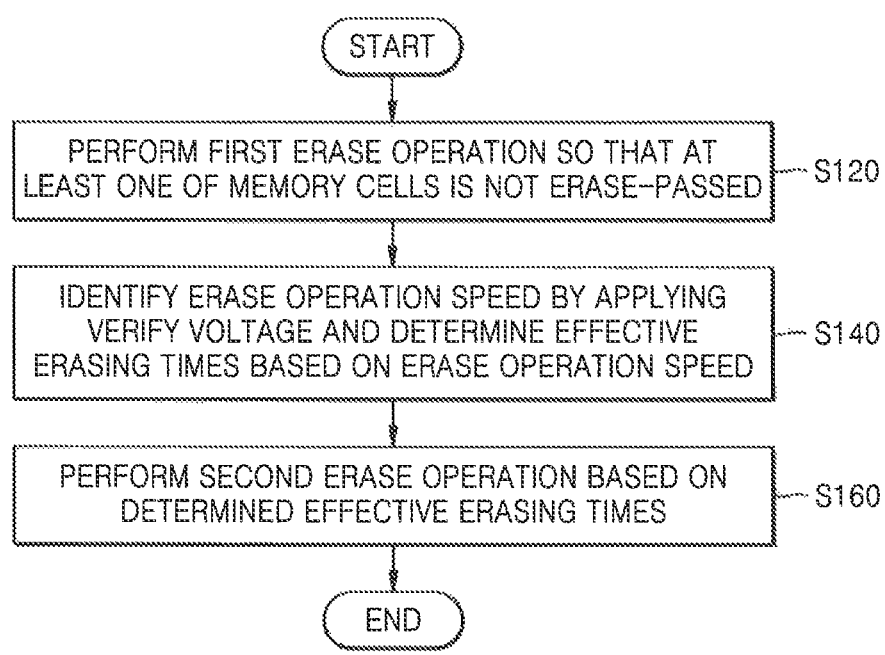
FIG. 5 is a flowchart for explaining an erase method of a memory device according to an exemplary embodiment of the inventive concept.

FIG. 5 is a flowchart for explaining an erase method of the memory device 10 according to an exemplary embodiment of the inventive concept. FIG. 5 will be described with reference to FIG. 1.

The memory device 10 may perform a first erase operation on the memory cells in a first erase period so that at least one of the memory cells, included in the memory block (e.g., one of BLK1 to BLKz) and connected to each of the plurality of word lines WL, is not erase-passed (S120). The first erase operation may be performed for one memory block. An erase pass may be a case where all the memory cells in the memory block are erased by the erase operation. In the first erase period, different erase voltages may be applied to the memory cells connected to each of the plurality of word lines WL. In other words, the erase operation may be performed during the erase time which is different for each word line WL. For example, in the first erase period, a different erase voltage may be applied to each memory region including at least one word line WL. In other words, a different erase voltage may be applied to memory cells connected to each of the plurality of word lines WL, or the erase operation may be performed during the erase time which is different for each memory region.

After the first erase period, the memory device 10 may determine the erase operation speed by applying a verify voltage to at least some of the plurality of word lines WL, and determine the effective erasing time for each word line WL according to the determined erase operation speed (S140). The effective erasing time may be a time during which a memory cell is actually erased. For example, the memory device 10 may determine the effective erasing time for each of the plurality of memory regions by dividing the memory cells including the memory cells connected to one or more word lines WL into the plurality of memory regions. The dividing of the memory cells into the plurality of memory regions may be understood with reference to FIGS. 4A and 4B. For example, the verify voltage may be applied to at least one of the word lines WL, connected to each of the memory regions. The verify voltages applied to the memory regions may all be the same or all be different from each other, or some of the verify voltages may be the same while others may be different. An exemplary embodiment of the inventive concept in which the verify voltages applied to the memory regions are all the same will be described with reference to FIG. 6. An exemplary embodiment of the inventive concept in which the verify voltages are all different from each other will be described with reference to FIG. 10.

In an exemplary embodiment of the inventive concept, after applying the verify voltage to at least one of the word lines WL, the memory device 10 may determine an error rate for the memory cells connected to the word line WL to which the verify voltage is applied. For example, the number of off-cells among the memory cells connected to the word line WL to which the verify voltage is applied may be counted. An exemplary embodiment of the inventive concept for this case will be described with reference to FIGS. 7 and 8. In an exemplary embodiment of the inventive concept, the verify voltage may be applied to one selected word line WL among the word lines WL connected to each of the memory regions. An exemplary embodiment of the inventive concept for this case will be described with reference to FIG. 9. In an exemplary embodiment of the inventive concept, as the error rate of the memory cells connected to a first word line WL to which the verify voltage is applied increases, in other words, as the number of the off-cells among the memory cells connected to the first word line WL becomes larger, the memory device 10 may determine that the effective erasing time, of the memory cells connected to the first word line WL, is long. In an exemplary embodiment of the inventive concept, the memory device 10 may store a timing mapping table that matches the effective erasing time with a range of the number of the off-cells. This can be used to determine the effective erasing time depending on the number of the off-cells. An exemplary embodiment of the inventive concept for this case will be described with reference to FIG. 11.

The memory device 10 may perform, in the second erase period, a second erase operation on the memory cells connected to each of the word lines WL based on the determined effective erasing times (S160). For example, when the memory block (e.g., one of BLK1 to BLKz) is divided into a plurality of memory regions, the memory device 10 may perform the second erase operation on the memory cells based on the effective erasing time determined for each of the memory regions depending on the verify result for each of the memory regions. In an exemplary embodiment of the inventive concept, the memory device 10 may determine a value, which is equal to or greater than a longest value among the effective erasing times determined for each of the plurality of memory regions, as the second erasing time in the second erase period. After the substrate erase voltage is applied to the substrate of the memory device 10, the memory device 10 may apply the word line erase voltage during the erasing times to the word lines WL connected to each of the plurality of memory regions. The word line erase voltage may be a ground voltage. Thereafter, an erase inhibit voltage may be applied to the word lines WL for a time obtained by subtracting the effective erasing time of each word line WL from the second erasing time. An exemplary embodiment of the inventive concept for this ease will be described with reference to FIG. 12. In an exemplary embodiment of the inventive concept, when there is an erase-passed memory region after the first erase operation, the erase inhibit voltage may be applied to the word lines WL connected to the erase-passed memory region during the second erase execution period. An exemplary embodiment of the inventive concept for this case will be described with reference to FIGS. 15 and 16. In addition, the memory device 10 may, for example, in the second erase interval, control differently not only the effective erasing time of each memory region but also a magnitude of the word line erase voltage applied to the word lines WL connected to respective memory regions. An exemplary embodiment of the inventive concept for this case will be described with reference to FIG. 13.

Figure 6:
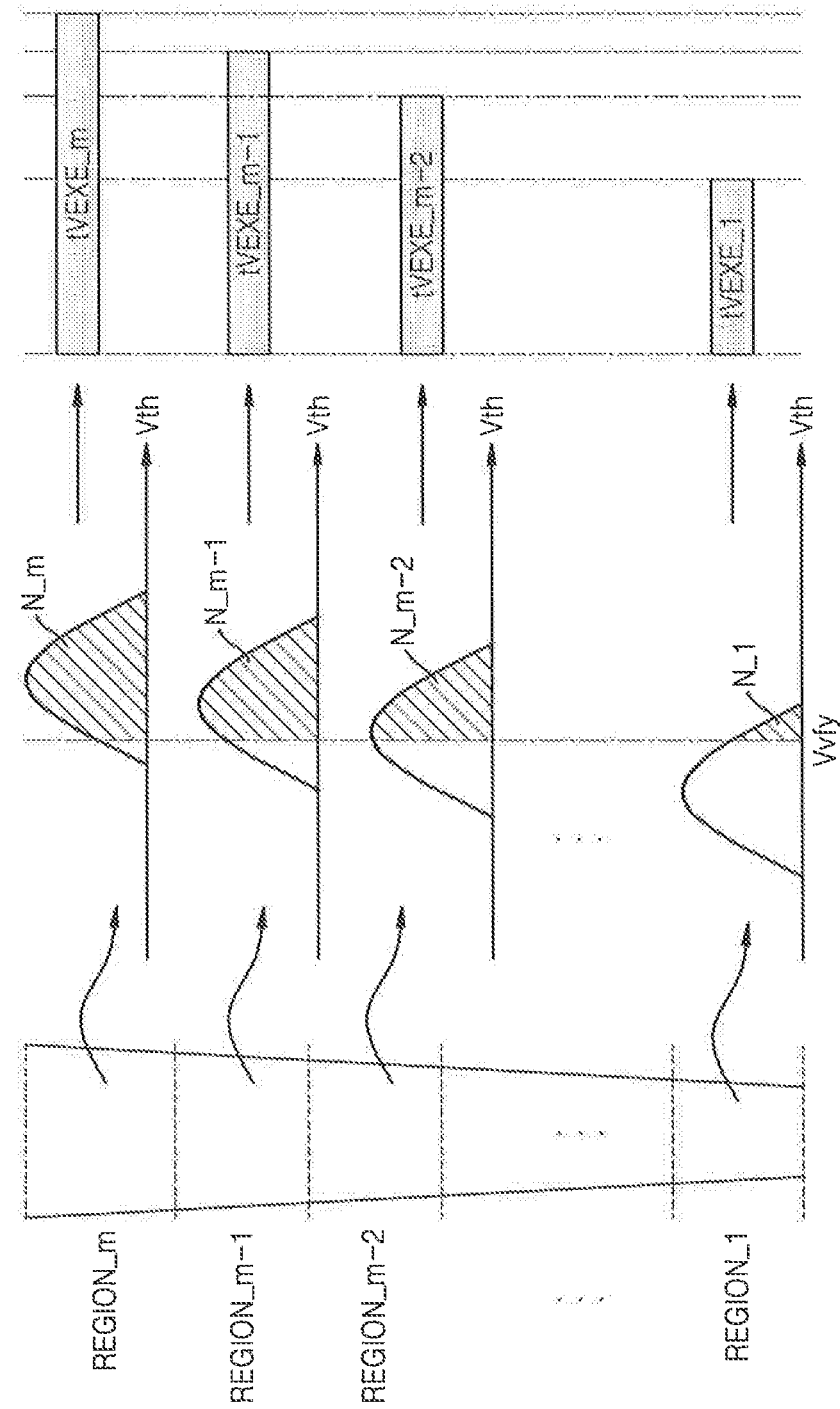
FIG. 6 illustrates a threshold voltage distribution after a first erase operation of each memory region according to an exemplary embodiment of the inventive concept.

FIG. 6 illustrates a threshold voltage distribution after the first erase operation of each memory region according to an exemplary embodiment of the inventive concept. FIG. 6 illustrates that the memory block has a three-dimensional structure, but the inventive concept is not limited thereto. The memory block may be divided into the first through $m^{th}$ memory regions REGION_1 through REGION_m.

In the first erase period, the first erase operation may be performed on the memory block during the first erase time. A speed at which each memory cell is erased may be different due to a location and/or physical characteristics of the memory cell and the memory block. For example, when the memory block has a three-dimensional structure, the channel hole size may increase as a word line WL gets farther away from the substrate. Accordingly, a rate at which the memory cell is erased may be gradually decreased. For example, the time spent erasing a memory cell at the first memory region REGION_1 may be greater than the time spent erasing a memory cell at the $m^{th}$ memory region REGION_m. Thus, after the first erase operation, the threshold voltage distribution of the $m^{th}$ memory region may be located to the right of the threshold voltage distribution of the first memory region. The control logic 500 in the memory device 10 may identify the locations of the threshold voltage distributions of the first through $m^{th}$ memory regions REGION_1 through REGION_m to determine the erase operation speed for each of the first through $m^{th}$ memory regions REGION_1 through REGION_m. For example, in the case of a memory region having a high erasing speed, the effective erasing time may be determined to be short so that the second erase operation is performed for a relatively short time. In addition, for example, in the case of a memory region having a slow erasing speed, the effective erasing time may be determined to be long so that the second erase operation is performed for a relatively long time.

Figure 7:
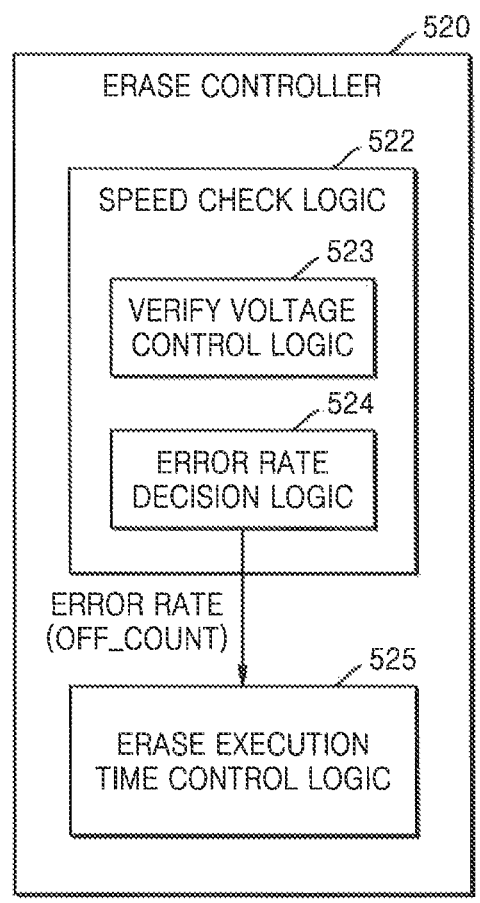
FIG. 7 illustrates an erase controller according to an exemplary embodiment of the inventive concept.

FIG. 7 illustrates the erase controller 520 according to an exemplary embodiment of the inventive concept. The erase controller 520 may control the erase operation of the memory device 10. To accomplish this, the erase controller 520 may include a speed check logic 522 and an erasing execution time control logic 525.

The speed check logic 522 may determine the speed of the first erase operation after the first erase operation is complete. The speed check logic 522 may apply the verify voltage to at least one of the word lines WL connected to each of the memory regions, and then, determine the error rate of the memory cells connected to the word lines WL to which the verify voltage is applied. For example, the speed check logic 522 may count the number of off-cells OFF_COUNT of memory cells connected to the word lines WL to which the verify voltage is applied. To accomplish this, the speed check logic 522 may include a verify voltage control logic 523 and an error rate decision logic 524.

The verify voltage control logic 523 may, after the first erase operation, control the verify voltage to be applied to at least one of the word lines WL connected to each of the memory regions. In an exemplary embodiment of the inventive concept, with reference to FIG. 6, the verify voltage control logic 523 may control an identical verify voltage Vvfy to be applied to at least one of the word lines WL connected to each of the memory regions. In an exemplary embodiment of the inventive concept, with reference to FIG. 10, the verify voltage control logic 523 may control different verify voltages Vvfy_1 through Vvfy_m to be applied to at least one of the word lines WL connected to each of the memory regions.

The error rate decision logic 524 may determine the error rate ERROR_RATE of the memory cells connected to the word lines WL to which the verify voltage is applied. For example, the speed check logic 522 may count the number of off-cells OFF_COUNT among memory cells connected to the word lines WL to which the verify voltage is applied. However, the present embodiment is not limited thereto, and the number of off cells OFF_COUNT may be obtained by counting the number of cm-cells among the memory cells and subtracting the number of on-cells from the total number of memory cells. The error rate decision logic. 524 may provide the error rate ERROR_RATE to the erasing execution time control logic 525. For example, the error rate decision logic 524 may provide the number of off-cells OFF_COUNT to the erasing execution time control logic 525. Referring to FIG. 6 together with FIG. 7, after the verify voltage Vvfy is applied to the word line WL connected to each of the first through $m^{th}$ memory regions REGION_1 through REGION_m, the error rate decision logic 524 may count the number of off-cells OFF_COUNT among the memory cells, that are connected to the word WL to which the voltage Vvfy is applied, in each of the first through $m^{th}$ memory regions REGION_1 through REGION_m. For example, the number of off-cells OFF_COUNT of the memory cells, in the first memory region REGION_1, among the memory cells connected to the word line WL to which the verify voltage Vvfy is applied may be a first number Similarly, the number of off-cells OFF_COUNT of the memory cells, in each of the $(m-2)^{th}$ through the $m^{th}$ memory regions REGION_m-2 through REGION_m, connected to the word line WL to which the verify voltage Vvfy is applied may be a $(m-2)^{th}$ number N_m-2 through an $m^{th}$ number N_m, respectively. For example, the number may gradually increase from the first number N_1 toward the $m^{th}$ number N_m.

The erasing execution time control logic 525 may receive the error rate ERROR_RATE from the error rate decision logic 524. The erasing execution time control logic 525 may control the effective erasing time that denotes a time for the second erase operation to be performed in the second erase period, based on the received error rate ERROR_RATE. The error rate ERROR_RATE may include information about the number of off-cells OFF_COUNT. The erasing execution time control logic 525 may set the effective erasing time of the memory region having a greater error rate ERROR_RATE to be longer, and thus, may control the effective erasing time of the memory region having a greater number of off-cells OFF_COUNT to be longer. Referring to FIG. 6, the erasing execution time control logic 525 may determine the effective erasing time in the second erase execution period of the first memory region REGION_1 based on the first number N_1, as the first effective erasing time tVEXE_1. Similarly, the erasing execution time control logic 525 may determine the effective erasing time in the second erase execution period of the $(m-2)^{th}$ through the $m^{th}$ memory regions REGION_m-2 through REGION_m as a $(m-2)^{th}$ through the re effective erasing time tVEXE_m-2 through tVEXE_m, based on the $(m-2)^{th}$ number through the $m^{th}$ number, respectively. For example, a value of the effective erasing time may gradually increase from the first effective erasing time, tVEXE_1 toward the $m^{th}$ effective erasing time tVEXE_m.

The erase controller 520 may determine the erase operation speed for each memory region through a verify operation after the first erase operation. Thereafter, the erase controller 520 may control the widths of the threshold voltage distributions of the erased memory cells to be narrow and prevent a deep erase. This is done, for example, by controlling the effective erasing time in the second erase operation period based on the determined erase operation speed.

Figure 8:
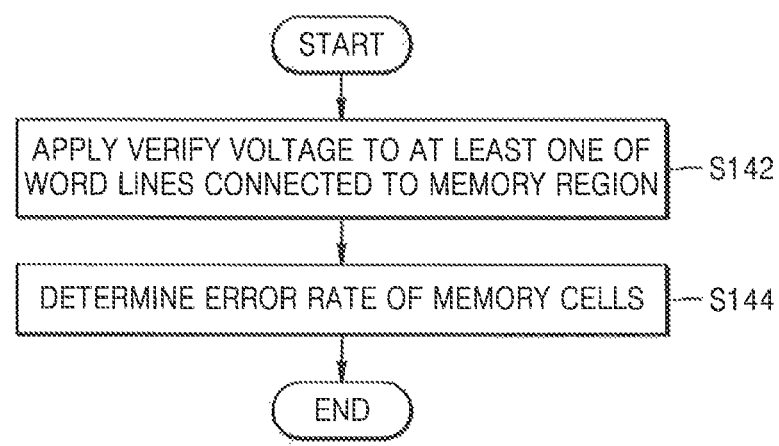
FIG. 8 is a flowchart for explaining a memory block verification method according to an exemplary embodiment of the inventive concept.

FIG. 8 is a flowchart for explaining a memory block verification method according to an exemplary embodiment of the inventive concept. FIG. 8 will be described with reference to FIG. 7.

The verify voltage control logic 523 included in the speed check logic 522 in the erase controller 520 may control the verify voltage to be applied to at least one of the word lines WL connected to each of the memory regions (S142). The verify voltages may be the same value for all memory regions or may be different values from each other for each memory region, or may be the same value for some of the memory regions and different values for other memory regions.

The error rate decision logic 524 included in the speed check logic 522 in the erase controller 520 may determine the error rate OFF_COUNT of the memory cells connected to the word lines WL to which the verify voltage is applied (S144). For example, the speed check logic 522 may count the number of off-cells OFF_COUNT among memory cells connected to the word lines WL to which the verify voltage is applied. The error rate decision logic 524 may provide the error rate ERROR_RATE to the erasing execution time control logic 525. For example, the error rate decision logic 524 may provide the number of off-cells OFF_COUNT to the erasing execution time control logic 525. For convenience of description, it will be described below that the error rate decision logic 524 counts the number of off-cells OFF_COUNT among the memory cells connected to the word lines WL to which the verify voltage is applied and provides the number of off-cells OFF_COUNT to the erasing execution time control logic 525. However, the error rate ERROR_RATE may not be limited to the number of off-cells OFF_COUNT. For example, the error rate ERROR_RATE may represent various types of information about cells that fail the verify operation after the verify voltage has been applied thereto.

Figure 9:
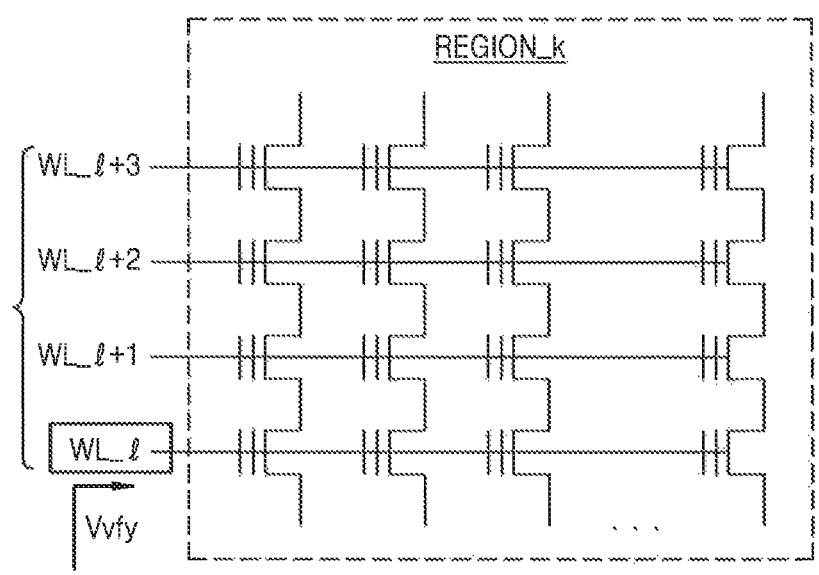
FIG. 9 illustrates a memory region according to an exemplary embodiment of the inventive concept.

FIG. 9 illustrates a $k^{th}$ memory region REGION_k (k is a natural number) according to an exemplary embodiment of the inventive concept. The $k^{th}$ memory region REGION_k may include memory cells connected to an lth through (l+3)th word lines WL_l through WL_l+3 (l is a natural number). Although FIG. 9 illustrates that the $k^{th}$ memory region REGION_k includes memory cells connected to four word lines WL, the inventive concept is not limited to just four word line WL. Referring to FIG. 8, a verification method of a memory block may include applying the verify voltage (S142) to at least one of the word lines WL connected to each of the memory regions. The verify voltage may be used to determine the erase operation speed for each memory region of the memory block. The number of off-cells may be counted to determine the erase operation speed of the memory region REGION_k by applying the verify voltage Vvfy to all of the plurality of word lines WL_l through WL_l+3 connected to the memory region REGION_k. However, the present embodiment is not limited thereto. For example, the verify voltage Vvfy may be applied only to a selected one of the word lines WL_l through WL_l+3. Thereafter, the control logic 500 may count the number of off-cells OFF_COUNT among the memory cells connected to the selected word line WL_l. The inventive concept is not limited thereto. For example, the verify voltage Vvfy may be applied to two or more of the word lines WL_l through WL_l+3.

The verify voltage Vvfy may be applied to the selected word line WL_l instead of being applied all the word lines WL_l through W_l+3 connected to the $k^{th}$ memory region REGION_k. Thus, a time required to determine the erase speed of the $k^{th}$ memory region REGION_k is reduced.

Figure 10:
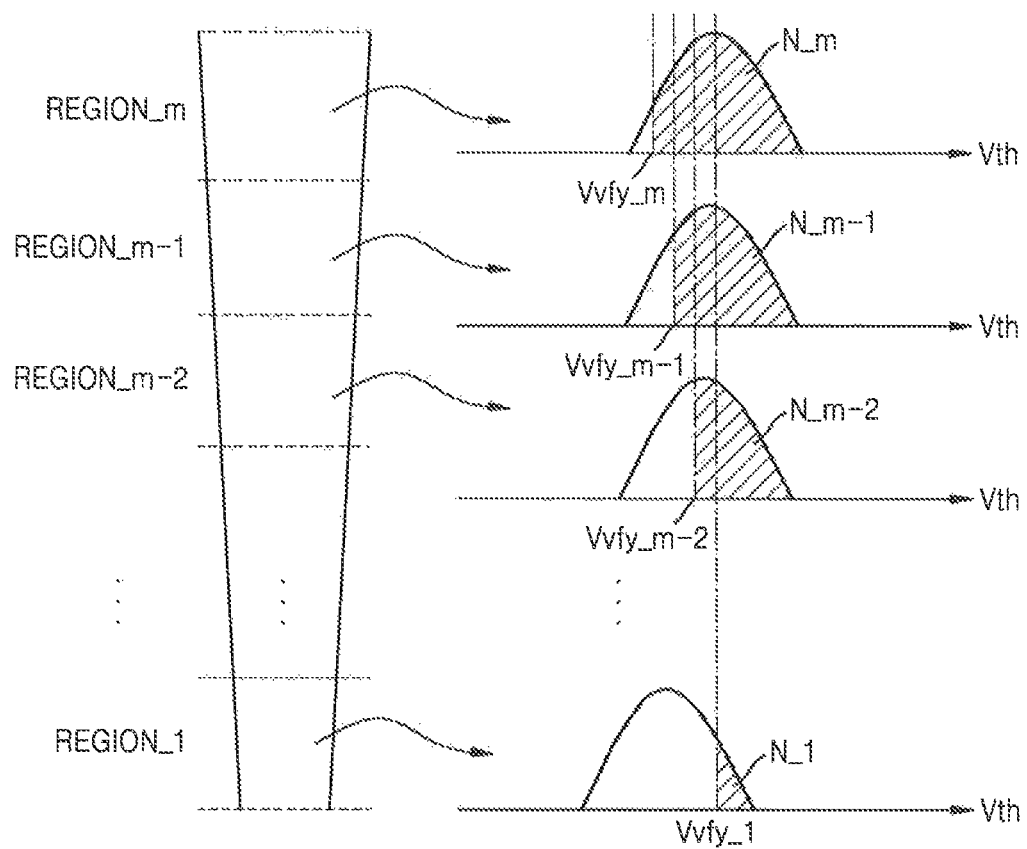
FIG. 10 illustrates a threshold voltage distribution after a first erase operation of each memory region according to an exemplary embodiment of the inventive concept.

FIG. 10 illustrates a threshold voltage distribution after the first erase operation of each memory region according to an exemplary embodiment of the inventive concept. FIG. 10 illustrates that the memory block has a three-dimensional structure, but the present embodiment is not limited thereto. The memory block may be divided into the plurality of memory regions REGION_1 through REGION_m.

In the first erase period, the first erase operation may be preformed on the memory block during the first erase time. A speed at which each memory cell is erased may be different due to a location and/or physical characteristics of the memory cell and the memory block. For example, when the memory block has a three-dimensional structure, the channel hole size may increase as a word line WL gets farther away from the substrate. Accordingly, a rate at which the memory cell is erased may be gradually decreased. For example, the time spent erasing a memory cell at the first memory region REGION_1 may be greater than the time spent erasing a memory cell at the $m^{th}$ memory region REGION_m. Thus, after the first erase operation, the threshold voltage distribution of the $m^{th}$ memory region may be located to the right of the threshold voltage distribution of the first memory region.

After the first erase operation, the verify voltages Vvfy_1 through Vvfy_m may be applied to at least one of the word lines WL connected to each of the first through $m^{th}$ memory regions REGION_1 through REGION_m, to verify the memory block. The verify voltages Vvfy_1 through Vvfy_m may be controlled to have different values depending on the erase operation speed, the number of word lines WL connected to the first through $m^{th}$ memory regions REGION_1 through REGION_m, a sensing environment, and the like. For example, the first through $m^{th}$ verify voltages Vvfy_1 through Vvfy_m applied to the word lines WL connected to the first through $m^{th}$ memory regions REGION_1 through REGION_m may be different from each other. For example, when the memory block has a three-dimensional structure, to increase performance of the memory device 10, the threshold voltage distribution of the memory cells connected to the word line WL closer to the substrate is located to the right. Thus, the control logic 500 may control the verify voltage to have a gradually smaller value from the first verify voltage Vvfy_1 toward the $m^{th}$ verify voltage Vvfy_m.

The control logic 500 may apply the first through the $m^{th}$ verify voltages through Vvfy_m to at least one of the word lines WL connected to the first through $m^{th}$ memory regions REGION_1 through REGION_m. Thereafter, the control logic 500 may count the number of off-cells OFF_COUNT connected to the word lines WL to which each verify voltage has been applied, and based on the counted number of off-cells OFF_COUNT, control the effective erasing time in the second erase execution period for each memory region.

By varying the verify voltage applied to each memory region, it is possible to form the threshold voltage distribution of the erased memory cell close to a desired shape after the erase operation is complete.

Figure 11:
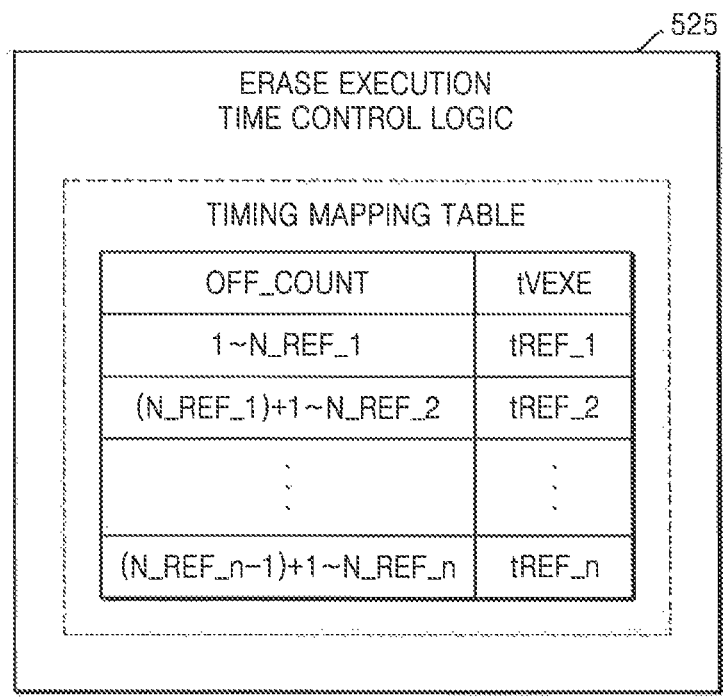
FIG. 11 illustrates an erasing time control logic according to an exemplary embodiment of the inventive concept.

FIG. 11 illustrates the erasing execution time control logic 252 according to an exemplary embodiment of the inventive concept. Descriptions of the erasing execution time control logic 525, which overlap those of FIG. 7, will be omitted.

The erasing execution time control logic 525 may variably control the effective erasing time tVEXE in the second erase period based on the number of off cells OFF_COUNT received from the error rate decision logic 524. To accomplish this, the erasing execution time control logic 525 may store a timing mapping table that matches the effective erasing time tVEXE with the number of off cells OFF_COUNT. For example, the timing mapping table may be a table that matches the effective erasing time tVEXE with a range of the number of off cells OFF_COUNT.

For example, when the number of off cells OFF_COUNT is equal to or more than 1 and equal to or less than the first reference number N_REF_1 the erasing execution time control logic 525 may set the effective erasing time tVEXE as the first reference time tREF_1. In addition, for example, when the number of off cells OFF_COUNT is greater than the first reference number N_REF_1 and equal to or less than a second reference number N_REF_2, the erasing execution time control logic 525 may set the effective erasing time tVEXE as a second reference time tREF_2. In addition, for example, when the number of off-cells OFF_COUNT is greater than a $(n-1)^{th}$ reference number N_REF_n−1 and less than or equal to an nth reference number N_REF_n, the erasing execution time control logic 525 may set the effective erasing time tVEXE as an nth reference time tREF_n. For example, a value of the reference time may gradually increase from the first reference time tREF_1 toward the nth reference time tREF_n.

The erasing execution time control logic 525 may narrowly form the width of the threshold voltage distribution of the erased memory cell, and thus, prevent a deep erase by determining differently the effective erasing time tVEXE in the second erase period depending on the number of off cells OFF_COUNT.

Figure 12:
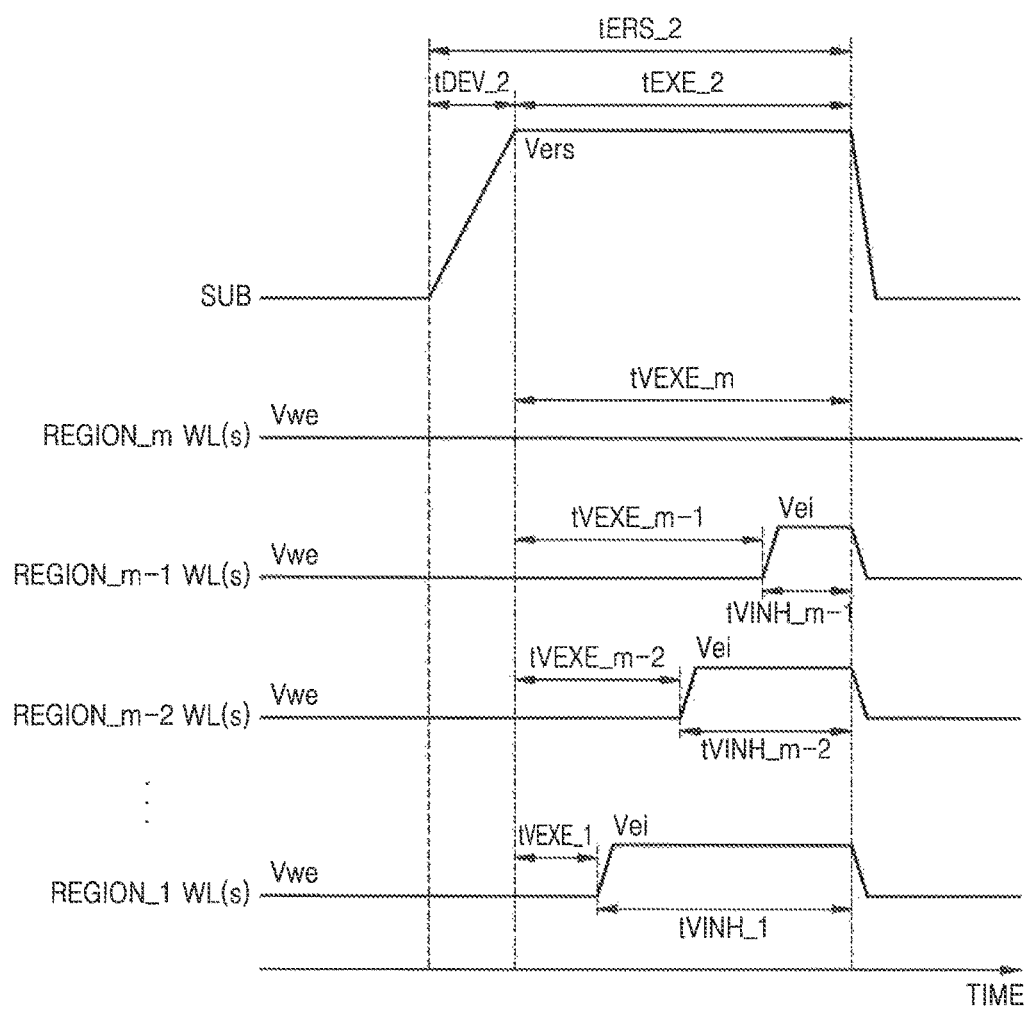
FIG. 12 illustrates voltages of a substrate and word lines over time according to an exemplary embodiment of the inventive concept.

FIG. 12 illustrates voltages of the substrate SUB and the word lines WL over time according to an exemplary embodiment of the inventive concept. Particularly, FIG. 12 illustrates the voltages of the substrate SUB and the word lines WL over time in the second erase period. The second erase period may include a second develop period in which a substrate erase voltage Vers is developed and a second erase execution period in which the erase operation is performed. A time required for the second erase period may be referred to as a second erase time tERS_2, a time required for the second develop period may be referred to as a second develop time tDEV_2, and a time required for the second erase execution period may be referred to as a second erasing time tEXE_2. The second erase execution period may include an effective erase execution period in which the erase operation is performed for each word line WL, and an effective inhibit period in which the erase operation is not performed. A time required for the effective erase execution period may be referred to as an effective erasing time and a time required for the effective inhibit period may be referred to as an effective inhibit time.

FIG. 12 will be described with reference to FIG. 6. After the first erase operation, the verify voltage $m^{th}$ may be applied to at least one of the word lines WL connected to each of the first through $m^{th}$ memory regions REGION_1 through REGION_m. Here, the control logic 500 may count the number of off cells OFF_COUNT among the memory cells connected to the word lines WL to which the verify voltage Vvfy is applied. The effective erasing time in the second erase execution period may be determined based on the number of off-cells OFF_COUNT. For example, the control logic 500 may determine the effective erasing time of the first memory region REGION_1 as the first effective erasing time tVEXE_1, and the effective erasing time of the $m^{th}$ memory region REGION_m as the $m^{th}$ execution time tEXET_m. At this time, the control logic 500 may determine as the second erasing time tEXE_2 a value equal to or greater than a maximum value among the effective erasing times tVEXE_1 through tVEXE_m. For example, the control logic 500 may determine as the second erasing time tEXE_2 a maximum value among the effective erasing times tVEXE_1 through tVEXE_m. For example, the control logic 500 may determine the $m^{th}$ effective erasing time tVEXE_m as the second erasing time tEXE_2. In the second erase execution period, the control logic 500 may apply a word line erase voltage Vwe to the word lines WL during the effective erasing time determined for each memory region. In addition, the control logic 500 may apply an erase inhibit voltage Vei to the word lines WL during a time period obtained by subtracting the effective erasing time from the second erasing time tEXE_2. The time obtained by subtracting the effective erasing time from the second erasing time tEXE_2 may be referred to as the effective inhibit time.

For example, in the second erase execution period, the word line erase voltage Vwe may be applied to the word lines WL connected to the first memory region REGION_1 during the first effective erasing time tVEXE_1, and the erase inhibit voltage Vei may be applied to the word lines WL connected to the first memory region REGION_1 during a first effective inhibit time tVINH_1. The word line erase voltage Vwe may be a ground voltage or a voltage value slightly different from the ground voltage, and the erase inhibit voltage Vei may have a value of several volts, but the present embodiment is not limited thereto. Thus, the memory cells included in the first memory region REGION_1 may be subjected to the second erase operation during the first effective erasing time tVEXE_1. The first effective inhibit time tVINH_1 may be a time obtained by subtracting the first effective erasing time tVEXE_1 from the second erasing time tEXE_2.

In addition, for example, in the second erase execution period, the word lines WL connected to the $(m-1)^{th}$ memory region REGION_m−1 may be subjected to the word line erase voltage Vwe during the $(m-1)^{th}$ effective erasing time tVEXE_m−1, and the erase inhibit voltage Vei during the $(m-1)^{th}$ effective inhibit time tVINH_m−1. Thus, the memory cells included in the $(m-1)^{th}$ memory region REGION_m−1 may be subjected to the second erase operation during the $(m-1)^{th}$ effective erasing time tVEXE_m−1. The $(m-1)^{th}$ effective inhibit time tVINH_m−1 may be a time obtained by subtracting the (m−1)th effective erasing time tVEXE_m−1 from the second erasing time tEXE_2.

In addition, for example, in the second erase execution period, the word line erase voltage Vwe may be applied to the word lines WL connected to the $m^{th}$ memory region REGION_m during the $m^{th}$ effective erasing time tVEXE_m. Thus, the memory cells included in the $m^{th}$ memory region REGION_m may be subjected to the second erase operation during the $m^{th}$ effective erasing time tVEXE_m.

By controlling the time to perform the second erase operation differently for each memory region as described above, the threshold voltage distribution of the erased cell after the erase operation is complete may be narrowly formed, and thus, a deep erase may be prevented.

Figure 13:
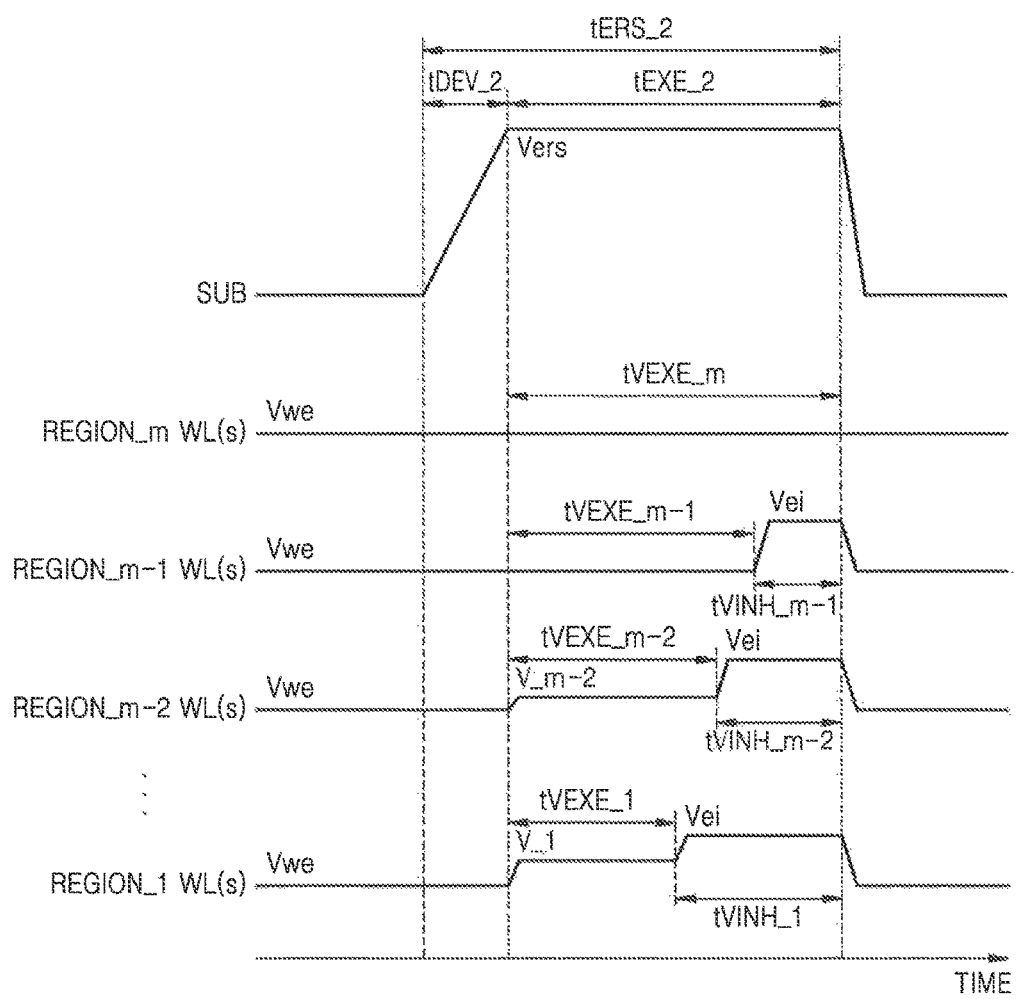
FIG. 13 illustrates voltages of a substrate and word lines over time according to an exemplary embodiment of the inventive concept.

FIG. 13 illustrates voltages of the substrate SUB and the word lines WL over time according to an exemplary embodiment of the inventive concept. Particularly, FIG. 13 illustrates the voltages of the substrate SUB and the word lines WL over time in the second erase period. The second erase period may include a second develop period in which the voltage of the substrate SUB is developed to the substrate erase voltage Vers and a second erase execution period in which the erase operation is performed. A time required for the second erase period may be referred to as a second erase time tERS_2, a time required for the second develop period may be referred to as a second develop time tDEV_2, and a time required for the second erase execution may be referred to as a second erasing time tEXE_2.

Shapes of the voltages applied to the substrate SUB and the word lines WL may be similar to those in FIG. 12. However, in the embodiment disclosed in FIG. 13, different voltages may be applied to the word lines WL for each memory region during the effective erasing time in the second erase execution period. For example, in the second erase execution period, the word lines WL connected to the first memory region REGION_1 may be subjected to a first voltage V_1 greater than the word line erase voltage Vwe during the first effective erasing, time tVEXE_1. The word lines WL connected to the first memory region REGION_1 may also be subjected to the erase inhibit voltage Vei during the first effective inhibit time tVINH_1. In addition, for example, in the second erase execution period, the word lines WL connected to the $(m-2)^{th}$ memory region REGION_m-2 may be subjected to an (m-2),th voltage V_M-2 greater than the word line erase voltage Vwe during the $(m-2)^{th}$ effective erasing time tVEXE_m-2. The first through $(m-2)^{th}$ voltages V_1 through V_m-2 may all have the same values or may be different from each other. For example, a value of the voltage may be decrease from the first voltage V_1 toward the $(m-2)^{th}$ voltage V_m-2. Although the word lines WL connected to the $(m-1)^{th}$ memory region REGION_m-1 are illustrated as being applied with the word line erase voltage Vwe during the $(m-1)^{th}$ effective erasing time tVEXE_m-1 the present embodiment is not limited thereto. For example, the word lines WL connected to the $(m-1)^{th}$ memory region REGION_m-1 may be subjected to a $(m-1)^{th}$ voltage greater than the word line erase voltage Vwe during the $(m-1)^{th}$ effective erasing time tVEXE_m-1. In addition, for example, for any natural number k less than m, the word lines WL connected to the kth to $(-1)^{th}$ memory regions may be respectively subjected to the word line erase voltage Vwe during the $k^{th}$ through $(m-1)^{th}$ effective erasing times.

In addition, FIG. 13 illustrates a case where different word line erase voltages Vwe are applied to the word lines WL for the first through $m^{th}$ memory regions REGION_1 through REGION_m so as to differently control the effective erasing time during the effective erasing time. However, the inventive concept is not limited thereto. For example, the memory block may be divided into a plurality of erasion-purpose memory regions, unlike the first through $m^{th}$ memory regions REGION_1 through REGION_m. In this case, different word line erase voltages Vwe may be applied to the word line WL for each erasion-purpose memory region during the effective erasing time in the second erase execution period.

Comparing FIG. 12 and FIG. 13, differences between the first through $m^{th}$ effective erasing times tVEXE_1 through tVEXE_m may be reduced, by applying a voltage greater than the word line erase voltage Vwe to the word line WL during the effective erasing time. This is possible because the erase operation speed is reduced since a voltage greater than the word line erase voltage Vwe is applied to the word line WL during the effective erasing time. As described above, in the second erase execution period, the effective erasing time may be differently controlled for each memory region, and at the same time, the voltages applied to the word lines WL may be varied.

Figure 14:
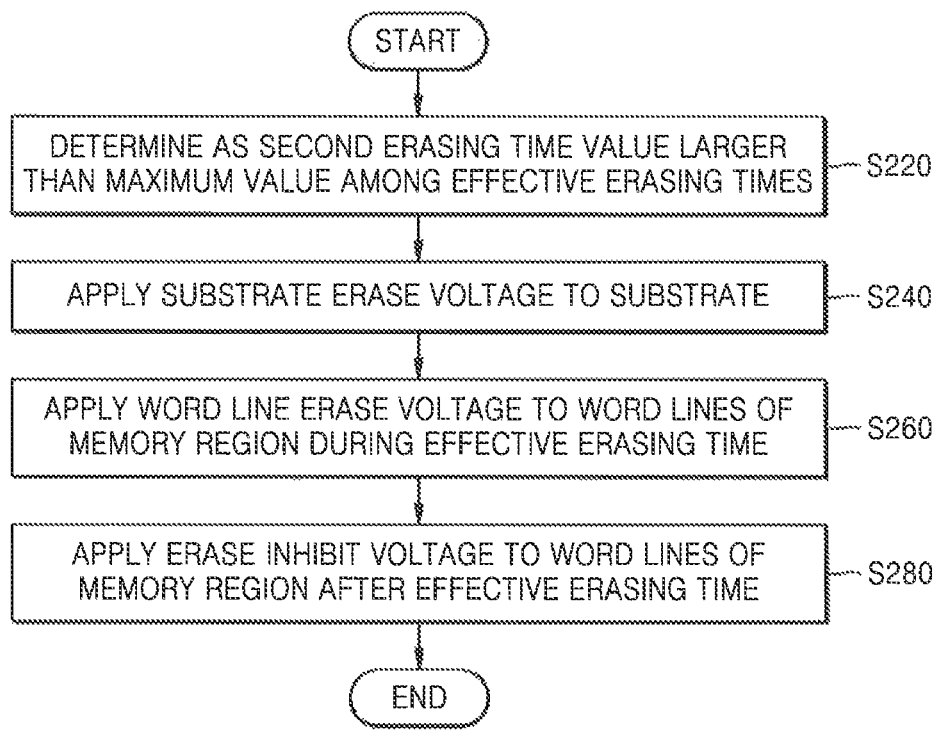
FIG. 14 is a flowchart for explaining a second erase operation according to an exemplary embodiment of the inventive concept.

FIG. 14 is a flowchart for explaining the second erase operation according to an exemplary embodiment of the inventive concept. FIG. 14 will be described with reference to FIG. 12.

The control logic 500 may determine as the second erasing time tEXE_2 a value greater than a maximum value among the effective erasing times determined for each memory region (S220). For example, the erasing execution time control logic 525 in the control logic 500 may determine as the second erasing time tEXE_2 the $m^{th}$ effective erasing time tVEXE_m which is the maximum value among the first through $m^{th}$ effective erasing times tVEXE_1 through tVEXE_m.

The control logic 500 may control the substrate erase voltage Vers to be applied to the SUB in the second erase period (S240). For example, the second erase period may include a second develop period in which a voltage of the substrate SUB is developed so that is can reach the substrate erase voltage Vers and a second erase execution period in which the substrate erase voltage Vers is applied to the substrate SUB.

The control logic 500, in the second erase execution period, may control the word line erase voltage Vwe to be applied to the word lines WL connected to each of the memory regions (S260). For example, the control logic 500 may control the word line erase voltage Vwe to be applied to the word lines WL connected to the first through $m^{th}$ memory regions REGION_1 through REGION_m during the first through $m^{th}$ effective erase times tVEXE_1 through. tVEXE_m.

The control logic 500, in the second erase execution period, may control the erase inhibit voltage Vei to be applied to the word lines WL connected to each of the memory regions during a time obtained by subtracting the effective erasing time from the second erasing time tEXE_2 (S280). For example, the control logic 500 may control the erase inhibit voltage Vei to be applied to word lines WL respectively connected to the first through $(m-1)^{th}$ memory regions REGION_1 through REGIONS_m-1 during the first through $(m-1)^{th}$ effective inhibit times tVINH_1 through tVINH_m-1.

Figure 15:
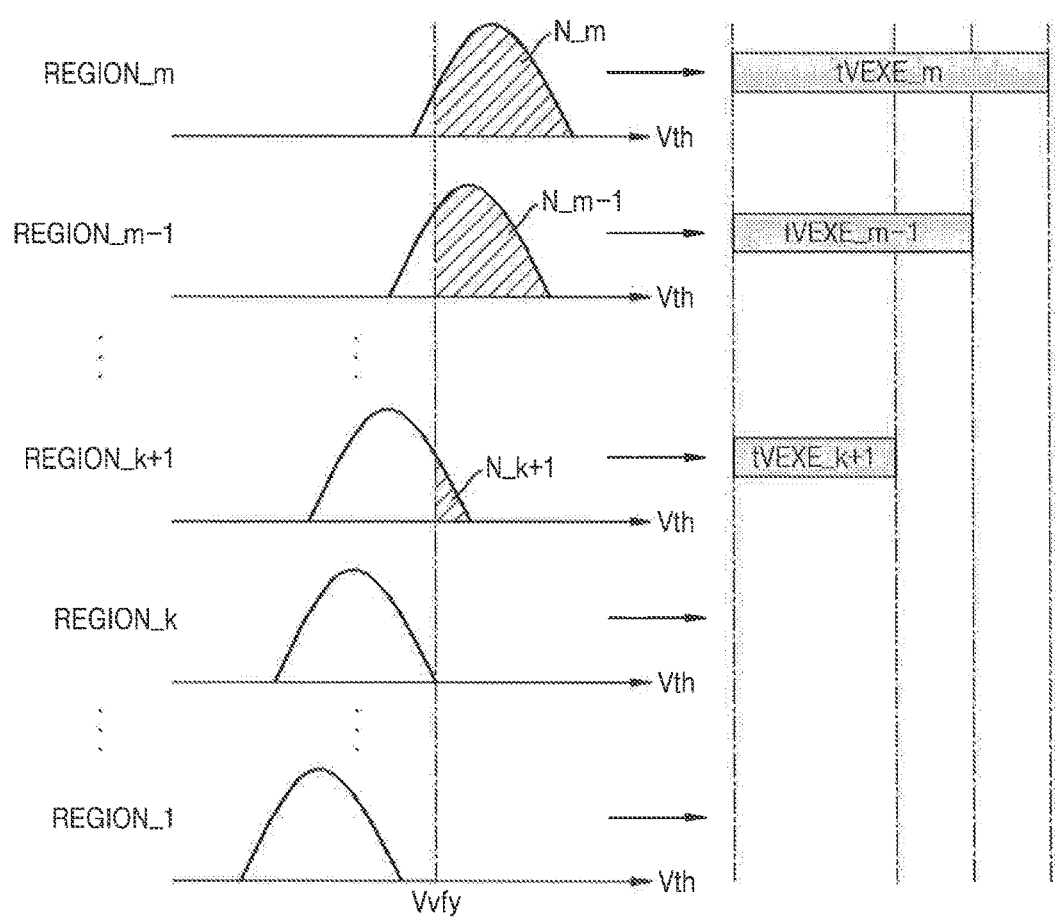
FIG. 15 illustrates a threshold voltage distribution after a first erase operation of each memory region according to an exemplary embodiment of the inventive concept.

FIG. 15 illustrates the threshold voltage distribution after the first erase operation of each memory region according to an exemplary embodiment of the inventive concept. The memory block may be divided into the first through $m^{th}$ memory regions REGION_1 through REGION_m. Descriptions of the first through $m^{th}$ memory regions REGION_1 through REGION_m, the application of the verify voltage Vvfy, the counting of the number of off-cells OFF_COUNT, and the effective erasing time that correspond to those of FIG. 6 may be omitted.

FIG. 15 illustrates a case where the first through $k^{th}$ memory regions REGION_1 through REGION_k are erase-passed depending on the verification result for the first through $k^{th}$ memory regions REGION_1 through REGION_k after the first erase operation. For example, the threshold voltage distribution of the first through $k^{th}$ memory regions REGION_1 through REGION_k after the first erase period may be located to the left of the verify voltage Vvfy. In this case, additional erase operations may not be needed for the memory cells connected to the first through $k^{th}$ memory regions REGION_1 through REGION_k. Thus, the first through $k^{th}$ effective erasing times tVEXE_1 through tVEXE_k may be determined to be about 0, and in the second erase execution period, the second erase operation may not be performed for the memory cells connected to the first through $k^{th}$ memory regions REGION_1 through REGION_k.

For the $(k+1)^{th}$ through $m^m$ memory regions REGION_k+1 through REGION_m that are not erase-passed, the $(k+1)^{th}$ through $m^{th}$ effective erasing times tVEXE_k+1 through tVEXE_m may be determined to be times in which the second erase operation is to be performed, based on the number of off-cells N_1 through N_m after the verify voltage Vvfy is applied. In this case, the value of the effective erasing time may gradually increase from the first effective erasing time tVEXE_1 toward the $m^{th}$ effective erasing time tVEXE_m. A voltage control method of the word lines WL connected to each memory region, e.g., the $(k+1)^{th}$ through $m^{th}$ memory regions REGION_k+1 through REGION_m, will be described below with reference to FIG. 16.

Figure 16:
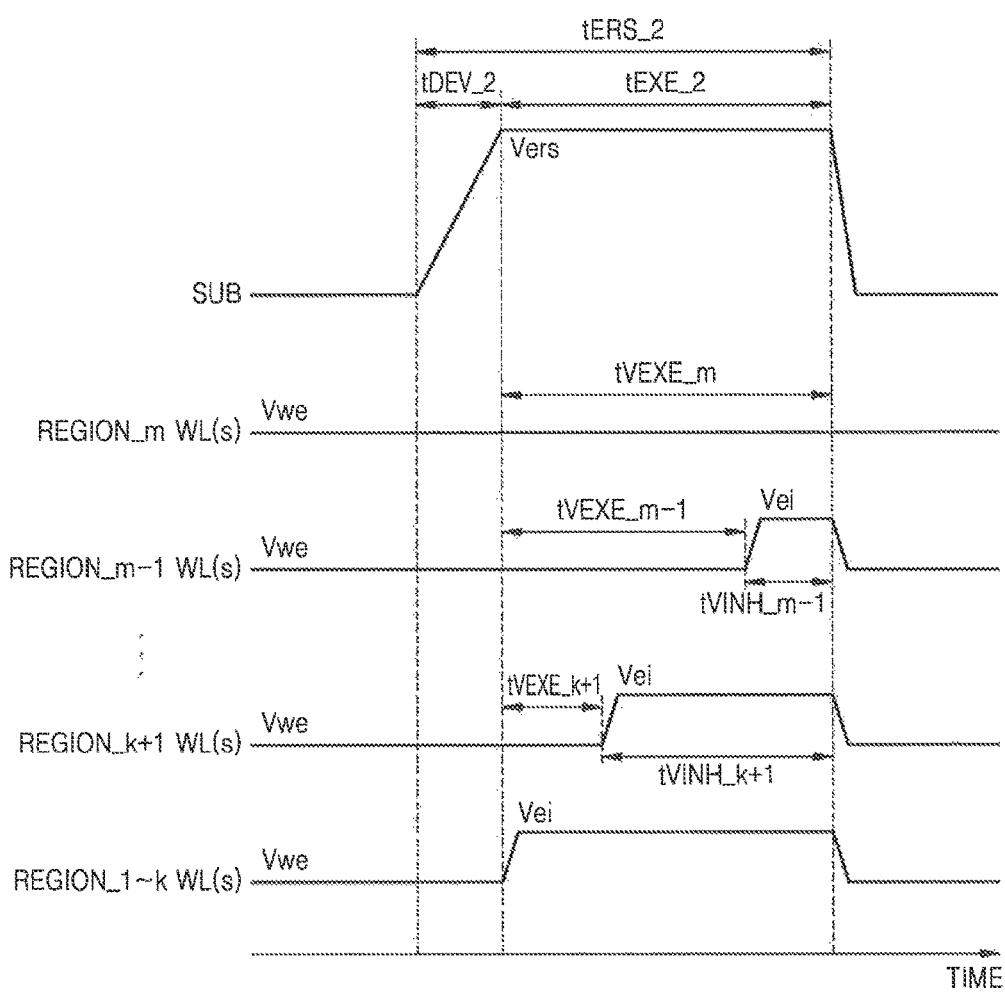
FIG. 16 illustrates voltages of a substrate and word lines over time according to an exemplary embodiment of the inventive concept.

FIG. 16 illustrates voltages of the substrate SUB and the word lines WL over time according to an exemplary embodiment of the inventive concept. Particularly, FIG. 16 illustrates graphs with respect to the case of FIG. 15. Descriptions of the second erase period, the voltages applied to the substrate SUB and the word lines WL that correspond to those of FIG. 12 may be omitted.

The control logic 500 may determine as the second erasing time tEXE_2 a value equal to or greater than a maximum value among the determined effective erasing times. In other words, the control logic 500 may determine as the second erasing time tEXE_2 the $m^{th}$ effective erasing time tVEXE_m that is the maximum value among the effective erasing times. The word lines WL connected to the $(k+1)^{th}$ through $(m-1)^{th}$ memory regions REGION_k+1 through REGION_m−1 may be subjected to the word line erase voltage Vwe during the $(k+1)^{th}$ through $(m-1)^{th}$ effective erasing times tVEXE_k+1 through tVEXE_m−1, respectively, and may be subjected to the erase inhibit voltage Vei during the $(k+1)^{th}$ through $(m-1)^{th}$ effective inhibit times tVINH_k+1 through tVINH_m−1, respectively.

In addition, the word lines WL included in the first through $k^{th}$ memory regions REGION_1 through REGION_k may be subjected to the erase inhibit voltage Vei in the second erasing time tEXE_2 throughout the second erase execution period. Thus, the second erase operation may not be performed in the memory cells included in the first through $k^{th}$ memory regions REGION_1 through REGION_k.

Figure 17:
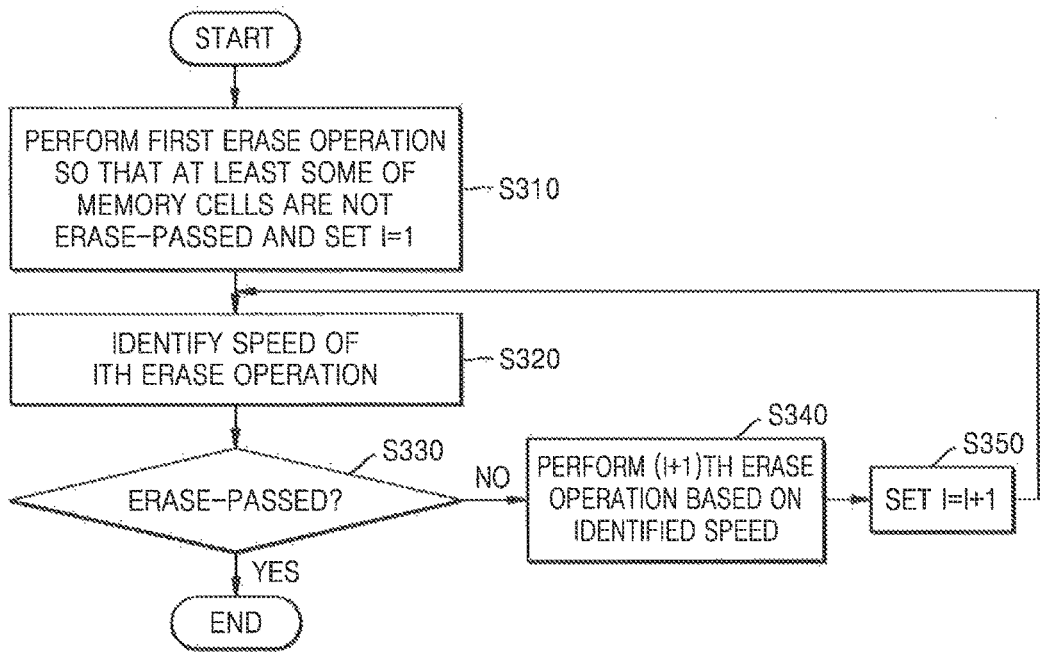
FIG. 17 is a flowchart for explaining an erase method of a memory device according to an exemplary embodiment of the inventive concept.

FIG. 17 is a flowchart for explaining an erase method of the memory device 10 according to an exemplary embodiment of the inventive concept. Particularly, FIG. 17 is a flowchart for explaining the erasing method of the memory device 10 with respect to a case where the erase pass does not occur after the second erase operation.

The memory device 10 may perform the first erase operation during the first erase time so that at least some of the memory cells included in the memory block to perform the erase operation are not erase-passed (S310). At this time, an identifier i may be initialized to about 1.

Thereafter, the memory device 10 may verify a speed of an ith erase operation (S320). For example, the memory device 10 may divide memory cells in a memory block into a plurality of memory regions, apply the verify voltage Vvfy to at least one of the word lines connected to each of the plurality of memory regions, and determine a speed of the ith erase operation by counting the number of off-cells OFF_COUNT.

Depending on a result of the verification described above, it may be determined whether all the memory cells are erase-passed (S330). For example, when the identifier i is about 1, the erase operation may be skipped because the first erase operation is performed so that at least some of the memory cells are not erase-passed. When all the memory cells have been erase-passed, the erase operation of the memory device 10 may be terminated.

When at least sonic of the memory cells have not been erase-passed, the control logic 500 of the memory device 10 may determine the effective erasing time, e.g., a time during which a $(i+1)^{th}$ erase operation is performed, based on the number of off-cells OFF_COUNT for each memory region, and may perform the $(i+1)^{th}$ erase operation based on the determined effective erasing time (S340). After performing the $(i+1)^{th}$ erase operation, the control logic 500 may increase the identifier i by about 1 (S350). Thereafter, an operation of determining the speed of the ith erase operation (S320) may proceed with the increased identifier i. After the first erase operation, an operation of determining the speed of the ith erase operation (S320) and an operation of performing the $(i+1)^{th}$ erase operation (S340) may be referred to as a verify-erase loop. In other words, the erase method of the memory device 10 may include N (N is a natural number of 1 or more) verify-erase loops until all the memory cells are erase-passed. For example, the erase method of the memory device 10 may include (N+1) erase operations.

As described above, the speed of the ith erase operation may be determined prior to performing the $(i+1)^{th}$ erase operation, and the effective erasing time during which the $(i+1)^{th}$ erase operation is performed may be controlled depending on the determination result. Accordingly, the width of the threshold voltage distribution of each memory cell may be narrowly formed and a deep erase may be prevented.

Figure 18:
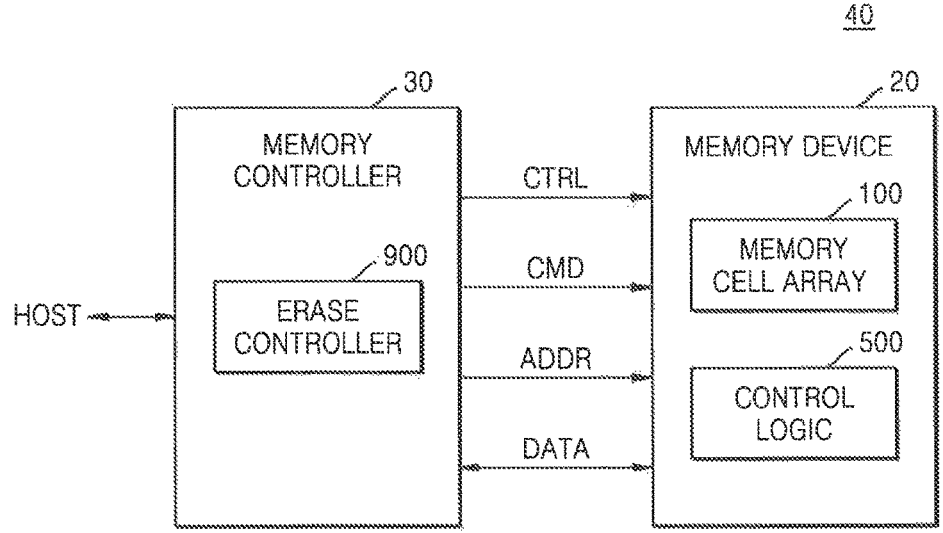
FIG. 18 illustrates a memory system according to an exemplary embodiment of the inventive concept.

FIG. 18 illustrates a memory system 40 according to an exemplary embodiment of the inventive concept. The memory system 40 may include a memory device 20 and a memory controller 30.

The memory device 20 may include the memory cell array 100 and the control logic 500. Descriptions of the memory cell array 100 and the control logic 500 that correspond to those of FIG. 1 may be omitted.

The memory controller 30 may control the memory device 20 in response to a request from a host HOST. For example, in response to a read/write request from the host HOST, the memory controller 30 may control the memory device 20 so that data DATA stored in the memory device 20 is read from the memory device 20 or that data DATA is written to the memory device 20. In addition, for example, the memory controller 30 may erase the data DATA stored in the memory device 20 in units of memory blocks in response to the erase request from the host HOST. The memory controller 30 may control the write, read and erase operations of the memory device 20 by providing an address ADDR, a command CMD, and the control signal CTRL to the memory device 20.

The memory controller 30 may further include an erase controller 900 according to an exemplary embodiment of the inventive concept. The erase controller 900 may generate the control signal CTRL so that the control logic 500 of the memory device 20 performs the erase operation. For example, the erase controller 900 may control the memory device 20 to perform the first erase operation such that at least some of the memory blocks arc not erase-passed when the memory device 20 performs the erase operation. In addition, the erase controller 900 may divide at least one of the memory Hocks into a plurality of memory regions after the first erase operation of the memory device 20, and may control the memory device 20 to apply the verify voltage to at least one of the word lines connected to each of the plurality of memory regions. The erase controller 900 may receive from the memory device 20 the number of the off cells that are turned off after the verify voltage, and based on the number of off-cells, may control the effective erasing times of the second erase operation to be different for each memory region. A method of controlling the effective erasing times to be different from each other may include a method of transmitting different erase command signals to the memory device 20 depending on the effective erasing time. In other words, the erase controller 900 may perform substantially the same control operation as the erase controller 520 of the control logic 500 described with reference to FIGS. 1 through 17.

Since the memory controller 30 controls the effective erasing time that is the time during which the second erase operation is performed based on the verification result after the first erase operation, the memory controller 30 may narrowly form the width of the threshold voltage distribution of the erased memory cell after the erase operation is complete and may prevent a deep erase.

Figure 19:
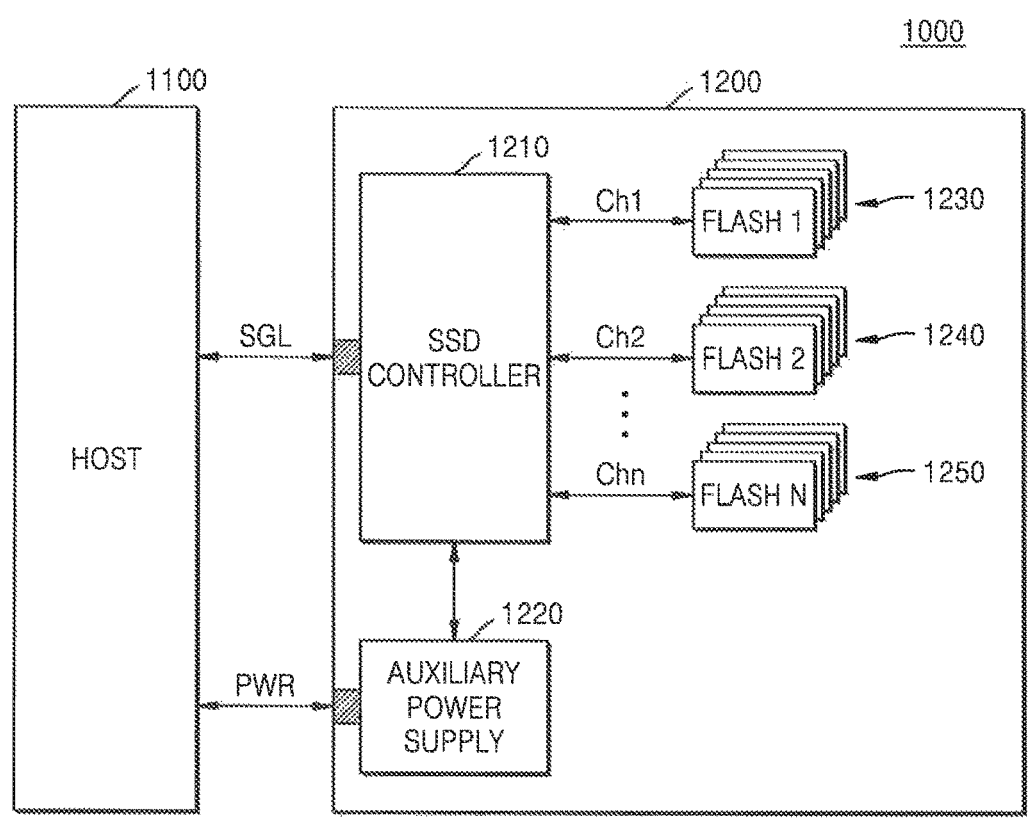
FIG. 19 illustrates a solid-state drive (SSD) system according to an exemplary embodiment of the inventive concept.

FIG. 19 illustrates a solid-state drive (SSD) system 1000 according to an exemplary embodiment of the inventive concept.

The SSD system. 1000 may include a host 1100 and an SSD 1200. The SSD 1200 may exchange signals SGL with the host 1100 via a signal connector and receive power PWR via a power connector. The SSD 1200 may include an SSD controller 1210, an auxiliary power supply 1220, and a plurality of memory devices 1230, 1240 and 1250. Here, the SSD 1200 may be implemented by using at least one of the embodiments illustrated in FIGS. 1 through 19. The memory devices 1230, 1240 and 1250 may be connected to the SSD controller 1210 via channels Ch1 to Chn.

According to the embodiments illustrated in FIGS. 1 through 18, when each of the plurality of memory devices 1230, 1240, and 1250 included in the SSD 1200 performs the erase operation in units of memory blocks, the first erase operation may be performed during the first erase time so that at least some of the memory blocks are not erase-passed, and the erase operation speed may be determined for each memory region by dividing the memory block into the plurality of memory regions after the first erase operation. In this way, the effective erasing time during which the second erase operation is performed based on the determined erase operation speed may variably controlled. In addition, according to an exemplary embodiment of the inventive concept illustrated in FIG. 19, the SSD controller 1210 included in the SSD 1200 may, when the erase operation is performed by the plurality of memory devices 1230, 1240, and 1250, determine the speed of the first erase operation for each memory region after the first erase operation. In addition, the SSD controller 1210 may control for each memory region the effective erasing time during which the second erase operation is performed based on the determination result.

In a memory device and a method of erasing the memory device according to exemplary embodiments of the present inventive concept, a threshold voltage distribution of an erased memory cell may be narrowly formed and a deep erase may be prevented by controlling an operation time of a second erase operation based on a speed verification result of a first erase operation, thereby increasing performance of the memory device.

While the inventive concept has been particularly shown and described with reference to exemplary embodiments thereof, it will be understood by one of ordinary skill in the art that various changes in form and details may be made therein without departing from the spirit and scope of the inventive concept as defined by the following claims.

What is claimed is:

1. A method of erasing a memory device, the method of erasing the memory device comprising:
   performing, in a first erase period, a first erase operation on memory cells respectively connected to a plurality of word lines, wherein at least one of the memory cells, which is included in a memory block, is not erase-passed;
   determining, after the first erase period, an erase operation speed by applying a verify voltage to at least one of the plurality of word lines, and determining an effective erasing time for each word line based on the determined erase operation speed; and
   performing, in a second erase period, a second erase operation on the memory cells respectively connected to the plurality of word lines based on the determined effective erasing times.

2. The method of erasing the memory device of claim 1, wherein the memory block comprises a plurality of memory regions; each memory region comprising memory cells connected to one or more of the word lines, and wherein the effective erasing time is determined for each of the plurality of memory regions.

3. The method of erasing the memory device of claim 2, wherein the plurality of memory regions comprise a first memory region comprising memory cells connected to a first number of word lines and a second memory region comprising memory cells connected to a second number of word lines.

4. The method of erasing the memory device of claim 2, wherein the verify voltage is applied differently to each of the plurality of memory regions.

5. The method of erasing the memory device of claim 4, wherein the plurality of word lines are vertically stacked on a substrate of the memory device, and wherein a smaller voltage is applied to a word line connected to the memory region farther from the substrate than a word line connected to the memory region closer to the substrate when determining the effective erasing time.

6. The method of erasing the memory device of claim 2, in the determining of the effective erasing time, the verify voltage is applied to a representative word line among word lines respectively connected to the plurality of memory regions.

7. The method of erasing the memory device of claim 2, wherein the second erase operation determines a second erasing time in the second erase period to be a value larger than a maximum value of the effective erasing times.

8. The method of erasing the memory device of claim 7, wherein the second erase operation comprises:
   after a substrate erase voltage is applied to the substrate of the memory device, applying word line erase voltages to the word lines respectively connected to the plurality of memory regions during the determined effective erasing times; and
   applying erase inhibit voltages to the word lines respectively connected to the plurality of memory regions, wherein a first erase inhibit voltage is applied during a first time obtained by subtracting the determined effective erasing time for a first word line from the determined second erasing time.

9. The method of erasing the memory device of claim 7, wherein the second erase operation comprises applying erase inhibit voltages to the word lines connected to the erased passed memory regions based on a result of applying the verify voltage during the determined second erasing time.

10. The method of erasing the memory device of claim 1, wherein the memory block comprises a plurality of memory regions, each memory region comprising memory cells connected to one of more of the word lines, and wherein the second erase operation applies different voltages to the word lines for each of the plurality of memory regions in the second erase period.

11. The method of erasing the memory device of claim 1, wherein the determining of the effective erasing time comprises:

applying the verify voltage to at least one of the word lines respectively connected to a plurality of memory regions; and identifying error rates of memory cells connected to the word lines to which the verify voltage has been applied, and determining the effective erasing times based on the error rates.

12. The method of erasing the memory device of claim 11, wherein the effective erasing times of the memory cells connected to the word lines to which the verify voltage has been applied increases as the error rate increases.

13. The method of erasing the memory device of claim 12, wherein the error rate comprises a number of off-cells among the memory cells connected to the word lines to which the verify voltage has been applied, and the effective erasing time is determined based on a timing mapping table that is stored in the memory device, wherein the timing mapping table is used to match the effective erasing times with corresponding ranges of the number of off-cells.

14. A memory device, comprising:
a memory cell array comprising memory cells respectively connected to word lines; and
a control logic configured to perform a first erase operation such that at least one of the memory cells respectively connected to the word lines is not erase-passed, control a verify voltage to be applied to at least one of the word lines, and to control, during a second erase period after the verify voltage has been applied, an effective erasing time for each word line, wherein the effective erasing time is based on an error rate of memory cells respectively connected to the word lines to which the verify voltage is applied, and wherein the effective erasing time is a time during which a second erase operation is performed.

15. The memory device of claim 14, wherein the control logic is configured to divide the word lines into a plurality of memory regions comprising the at least one word line and control the effective erasing time for each memory region.

16. The memory device of claim 15, wherein the error rate comprises a number of the off-cells respectively connected to the word lines to Which the verify voltage has been applied, and
wherein the control logic is configured to apply the verify voltage to at least one word line in each of the plurality of memory, regions, and control the effective erasing time to increase as the number of off-cells in each of the plurality of memory regions is increased.

17. The memory device of claim 15, wherein the word lines are stacked on a substrate of the memory device, and an effective erasing time of a memory region closer to the substrate is shorter than an effective erasing time of a memory region farther from the substrate.

18. The memory device of claim 15, wherein the control logic is configured to determine that a second erasing time is a largest value of the effective erasing times of the plurality of memory regions, control a word line erase voltage to be applied to word lines respectively connected to the plurality of memory regions during the effective erasing time in the second erase period, and control an erase inhibit voltage to be applied during a later portion of the second erase period.

19. A method of erasing a memory device comprising a plurality of word lines vertically stacked on a substrate, the method of erasing the memory device comprising:
performing, in a first erase period, a first erase operation so that at least one of memory cells included in a first memory region and a second memory region is not erase-passed, wherein the first and second memory regions each include memory cells connected to one or more word lines among the plurality of word lines;
applying a verify voltage to a first word line connected to the first memory region and a second word line connected to the second memory region; and
performing, in a second erase period, a second erase operation on the first memory region based on a first effective erase time that is determined for the first memory region based on a number of off-cells among memory cells connected to the first word line, and
performing, in the second erase period, the second erase operation on the first memory region based on a second effective erase time that is determined for the second memory region based on a number of off-cells among memory cells connected to the second word line,
wherein, when the number of the off cells in the second memory region is larger than the number of the off-cells in the first memory region, a second effective erase time for the second memory region is determined to be longer than a first effective erase time for the first memory region.

20. The method of erasing the memory device of claim 19, Wherein the applying of the verify voltage applies a first verify voltage to the first word line connected to the first memory region and a second verify voltage to the second word line connected to the second memory region, and when the first memory region is closer to the substrate than the second memory region, the first verify voltage is greater than the second verify voltage.

* * * * *